United States Patent
Chutinan et al.

(10) Patent No.: US 10,853,532 B2
(45) Date of Patent: Dec. 1, 2020

(54) GRAPHICAL MODELING FOR ACCESSING DYNAMIC SYSTEM STATES ACROSS DIFFERENT COMPONENTS

(71) Applicant: The MathWorks Inc., Natick, MA (US)

(72) Inventors: Alongkrit Chutinan, Dover, MA (US); Ramamurthy Mani, Wayland, MA (US); Srinath Avadhanula, Sudbury, MA (US); Fu Zhang, Sherborn, MA (US); Jing Xu, Newton, MA (US); Qu Zhang, Holliston, MA (US); John E. Ciolfi, Wellesley, MA (US)

(73) Assignee: The MathWorks, Inc., Natick, MA (US)

( * ) Notice: Subject to any disclaimer, the term of this patent is extended or adjusted under 35 U.S.C. 154(b) by 663 days.

(21) Appl. No.: 14/722,487

(22) Filed: May 27, 2015

(65) Prior Publication Data
US 2016/0350454 A1    Dec. 1, 2016

(51) Int. Cl.
*G06F 30/20*        (2020.01)

(52) U.S. Cl.
CPC .................... *G06F 30/20* (2020.01)

(58) Field of Classification Search
CPC ........ G06F 8/35; G06F 17/5009; G06F 17/50; G06F 17/5018; G06F 30/20
USPC ........................................... 703/6
See application file for complete search history.

(56) References Cited

U.S. PATENT DOCUMENTS

| 5,701,439 A * | 12/1997 | James | G06F 30/20 703/17 |
| 7,734,451 B2 * | 6/2010 | MacArthur | G05B 13/0295 703/2 |
| 8,762,589 B2 * | 6/2014 | Khan | G06F 13/28 710/14 |

(Continued)

FOREIGN PATENT DOCUMENTS

| WO | WO 2007/024908 | 3/2007 | |
| WO | WO-2007024908 A3 * | 6/2007 | ............. G06F 30/20 |

OTHER PUBLICATIONS

National Instruments Forum. Thread titled "Action Engines". Apr. 9, 2007. pp. 1-14.*

(Continued)

*Primary Examiner* — Kamini S Shah
*Assistant Examiner* — John E Johansen
(74) *Attorney, Agent, or Firm* — Cesari and McKenna, LLP; Michael R. Reinemann

(57) ABSTRACT

A method may include causing a first model to be executed. The causing the first model to be executed may be performed by a device. The method may further include causing a second model to be executed to simulate a functionality of the first model. The causing the second model to be executed may be performed by the device. The method may further include interacting with a model element, of the second model, associated with implicitly accessing information regarding a state of the first model. The state may be a representation of the first model at a particular simulation time-step. The interacting with the model may be performed by the device. The method may further include accessing, by the model element, information associated with the state of the first model. The accessing the information may be performed by the device.

20 Claims, 18 Drawing Sheets

(56) References Cited

U.S. PATENT DOCUMENTS

| | | | | |
|---|---|---|---|---|
| 8,768,658 B1* | 7/2014 | Ciolfi | ............... | G06F 30/3323 |
| | | | | 703/2 |
| 2003/0095141 A1* | 5/2003 | Shah | ............... | G06F 9/44505 |
| | | | | 715/735 |
| 2005/0257195 A1* | 11/2005 | Morrow | ............... | G06F 8/34 |
| | | | | 717/109 |
| 2006/0036798 A1* | 2/2006 | Dickey | ............... | G06F 8/34 |
| | | | | 711/100 |
| 2010/0250226 A1* | 9/2010 | Hirose | ............... | G06F 30/367 |
| | | | | 703/17 |
| 2013/0346055 A1* | 12/2013 | Cohen | ............... | G06F 17/5009 |
| | | | | 703/13 |
| 2016/0171130 A1* | 6/2016 | Boys | ............... | G06F 17/5009 |
| | | | | 703/6 |

OTHER PUBLICATIONS

ElQatary, Islam, and Basman Elhadidi. "Experimental Verification of Pitch Angles for Power Regulation of Variable Pitch Horizontal Axis Wind Turbine." 31st AIAA Applied Aerodynamics Conference. 2013. pp. 1-12. (Year: 2013).*

European Search Report for European Application No. 16001180.5; dated Oct. 19, 2016, 7 pgs.

Wikipedia, "Discrete time and continuous time," http://en.wikipedia.org/wiki/Discrete_time_and_continous_time, Apr. 30, 2015, 3 pages.

* cited by examiner

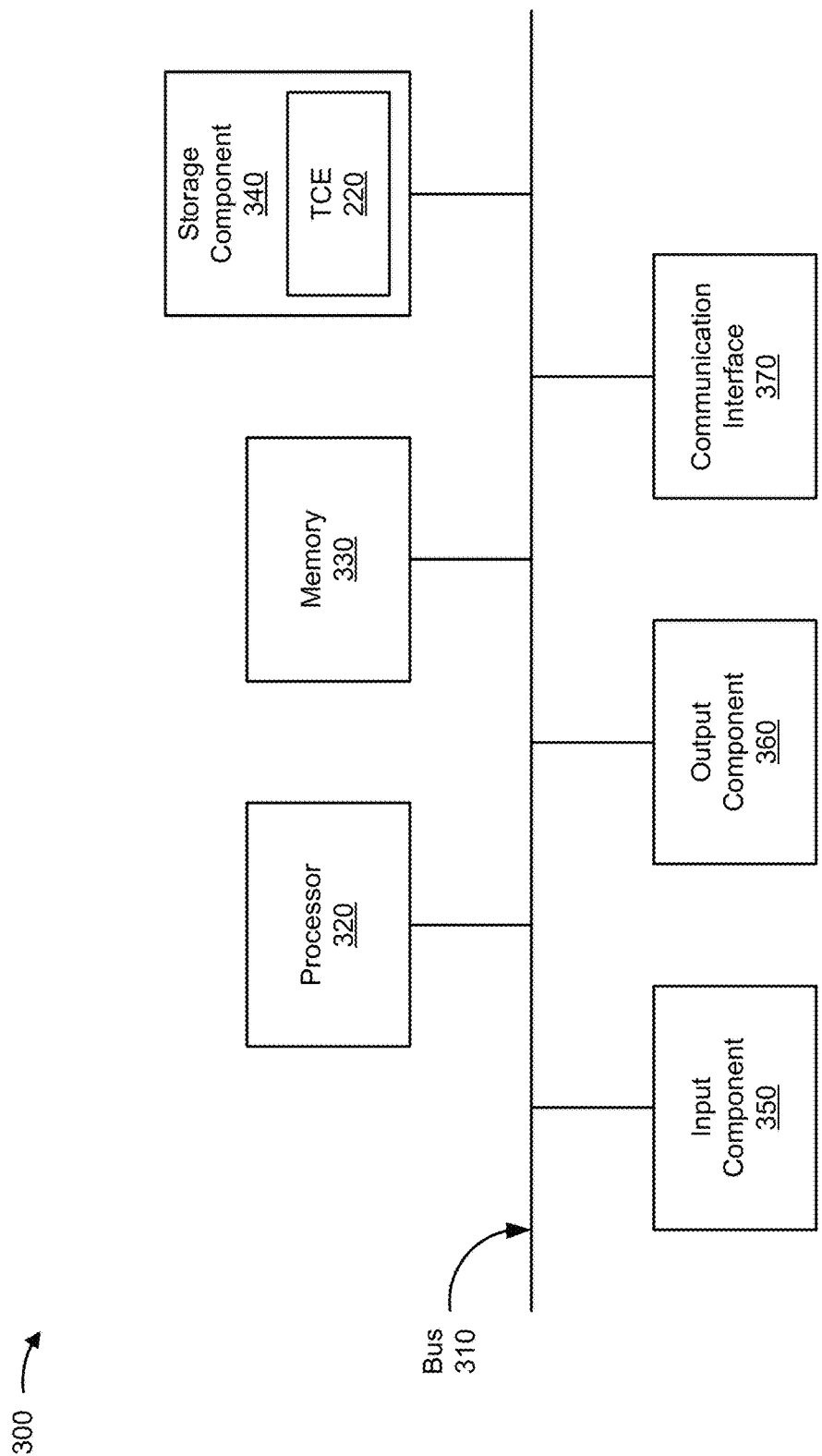

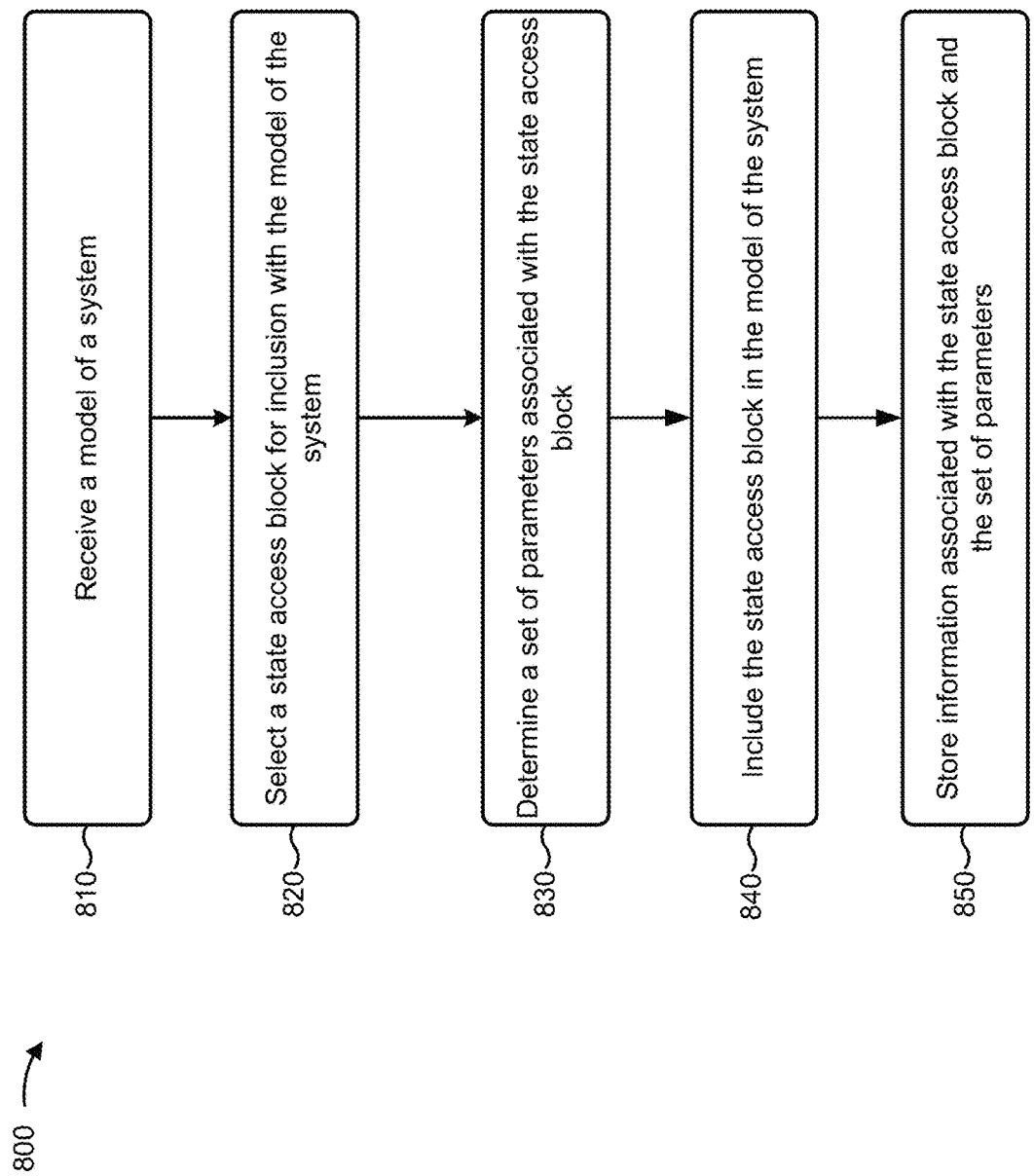

GRAPHICAL MODELING FOR ACCESSING DYNAMIC SYSTEM STATES ACROSS DIFFERENT COMPONENTS

BRIEF DESCRIPTION OF THE DRAWINGS

FIG. 3 is a diagram of example components of one or more devices of FIG. 2;

FIGS. 8A and 8B are flow charts of an example process for utilizing a state access block in a model.

DETAILED DESCRIPTION

Figure 1:
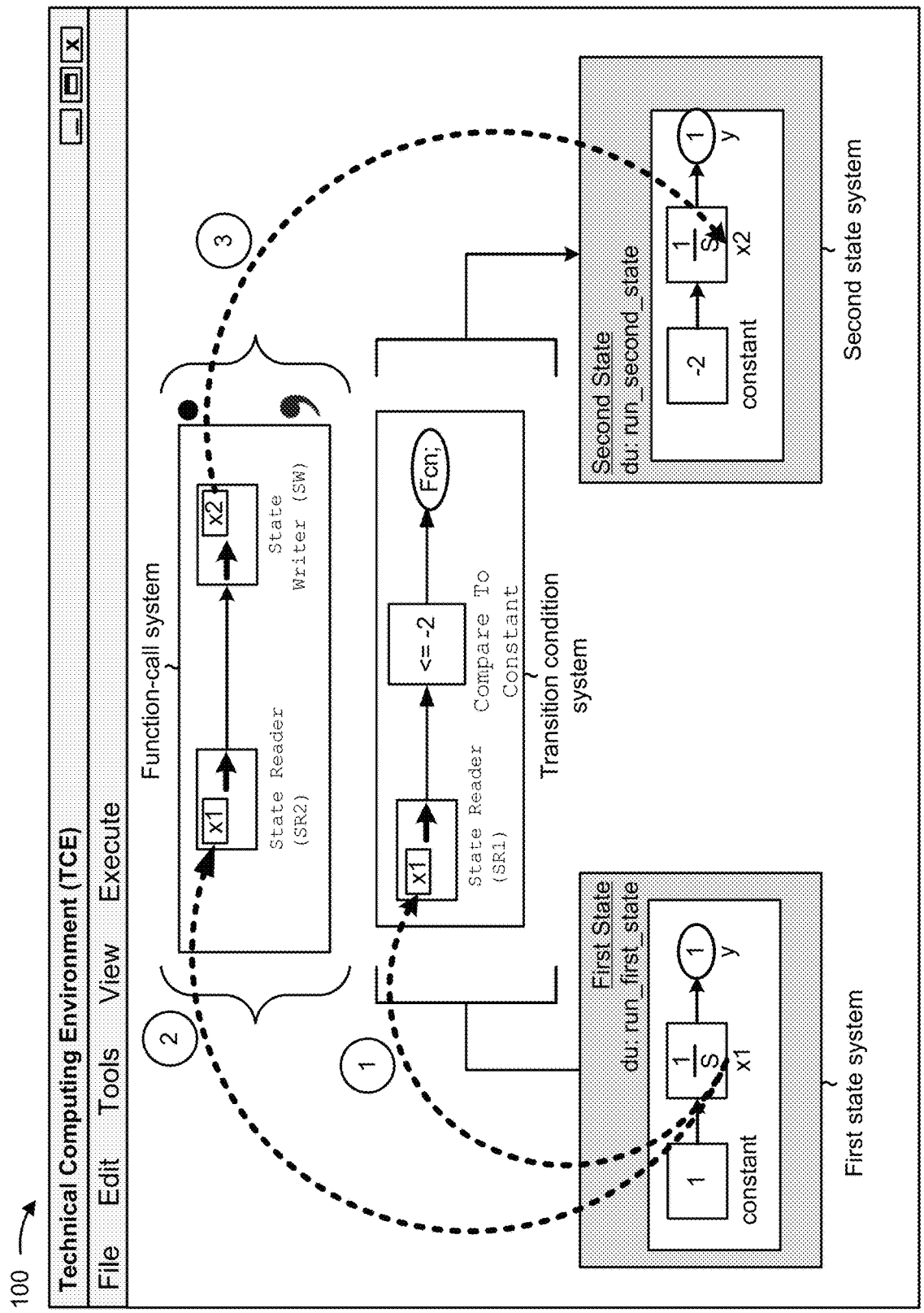
FIG. 1 is a diagram of an overview of an example implementation described herein.

The following detailed description of example implementations refers to the accompanying drawings. The same reference numbers in different drawings may identify the same or similar elements.

A user may utilize a model to simulate a system or a subsystem (e.g., a portion of the system), to simulate output of a mathematical equation, or the like. The model may include a model element (e.g., a block) that is associated with a state (e.g., a state of a dynamic system, a state of a discrete event system, a state of a state transition diagram, a state of a numerical solver system, etc.). For example, the model element may be associated with a value at a particular time. Periodically, the user may desire to access a state associated with the model (e.g., for alteration, for utilization in a model operation, a model functionality, a model computation, etc.), and may do so utilizing program code, a set of merge blocks, or the like.

Some users develop complex techniques for achieving a desired behavior of a state and to allow for modification and/or initialization of this state. For example, a user may add model elements and/or subsystems that include extensive connectors to set the state. However, accessing the state of the variable in such a manner may obfuscate functionality, limit usage of linear analysis tools provided by a modeling environment, and may be time-consuming and error prone. For example, adding model elements, subsystems, or other complex techniques to handle state behaviors may obfuscate a model by adding elements and/or subsystems unnecessary for core model operation. Adding elements and/or subsystems may result in other users spending substantial time in attempting to comprehend how the model functions. Moreover, utilizing a set of connectors to connect a set of model elements to set a state may limit the user to a single initialization state.

Implementations, described herein, may utilize a state access block, such as a state reader block, a state writer block, or the like, to directly access a state of a model graphically. A state access block and/or a textual primitive associated with state access may implicitly reference and/or access information associated with a state of a model (e.g., a model of a system). For example the state access block may reference a value of a state variable directly and without using a set of signal lines, connectors, or the like. In this way, the user may simplify aspects of the model used to manipulate a state in a continuous time application, a discrete time application, a discrete event application, a combination of continuous and discrete time applications, or the like. Similarly, a state access textual primitive may be utilized to reference the value of a state variable directly without using a set of signal lines, connectors or the like.

The state that is accessed by the state access block may include a dynamic model state and/or a dynamic system state. A dynamic model state, for a differential equation based model, may refer to a value of the state as a function of time (e.g., as modeled by a set of time derivatives, integrators, or the like). A dynamic model state, for a discrete time system, may refer to a value of the state as a function of time (e.g., as modeled by a time delay). A dynamic model state, for a discrete event system, may refer to a value of the state as a function of time (e.g., as modeled by a time advance operation).

FIG. 1 is a diagram of an overview of an example implementation 100 described herein. As shown in FIG. 1, example implementation 100 may include a client device that includes a technical computing environment (TCE). For example, a set of blocks may be displayed by the client device that include a first system that includes a continuous time operation (e.g., a continuous dynamic) that is associated with a first state, a second system that includes a continuous time operation associated with a second state, a transition condition system that is associated with a discrete time operation (e.g., a discrete dynamic), and a function-call system.

Blocks of the transition condition system are associated with modeling a condition that, when satisfied, indicates that the client device is to transition from executing blocks of the first system to executing blocks of the second system. The transition condition system may be utilized to graphically and/or textually represent a logical condition that must be satisfied for the transition to occur. For example, the transition condition system may graphically represent comparing a variable to a constant. The function-call system is associated with graphically modeling a function that the client device causes to be executed when transitioning from executing the first model to executing the second model. The function-call model may be utilized to graphically represent a textual function-call. For example, the function-call model may graphically represent setting a first variable to equal a second variable. Assume that the client device causes the first state system to be executed and determines that the transition condition system is to be evaluated to determine whether the condition is satisfied. In another example, the function-call system may be represented using textual primitives that facilitate state transition.

As further shown by FIG. 1, and by reference number 1, the transition condition system includes a first type of state access block. A state access block may refer to a model element that lacks a temporal operation but may implicitly access a state of a block that includes a temporal operation. For example, the state access block may include a state reader block, a state writer block, or the like. Additionally, or alternatively, a state access block may also refer to a textual model element that implicitly accesses a state of a block that includes a temporal operation. Implicitly accessing a state may refer to directly accessing the state without utilizing a set of signal lines and/or signal wires. In this case, reference number 1 indicates a first state reader block (SR1) that may read a state of the model. Reading a state of a model may refer to receiving a value for a block at a particular time.

The SR1 may read a particular state of a block. The client device may determine which state to read (e.g., when the block is associated with multiple states, multiple variables, or the like) based on an indicator associated with SR1, an indication provided by a user (e.g., a click and drag, a selection, a graphical linking, etc.), or the like. The client device may maintain information indicating the state that SR1 is to read from the block. For example, the SR1 may read a value of "x1," associated with the first state. The SR1 may provide information associated with x1 to another model element that may utilize the particular state. For example, the SR1 may provide a value of x1 to a "Compare to Constant" model block that is associated with performing a logical operation. The logical operation may include determining whether $x1 \leq 2$ evaluates to true. In this case, if the logical operation is satisfied as true, the transition condition system may cause a transition from executing the first state to executing the second state.

With respect to FIG. 1, assume that the client device determines that the logical operation evaluates to true. As shown by reference number 2, the client device may cause the function-call system to be executed based on the condition being satisfied. Executing the function-call system may include executing a set of blocks of the function call system. The function-call system includes a second state reader block (SR2) and a state writer block (SW). The client device may cause the SR2 to be executed and the SR2 may read a state of a particular variable. For example, the SR2 may read a particular state of x1 to determine a value of x1. The SR2 may provide the value of x1 to the SW.

As shown by reference number 3, the client device may cause the SW to be executed based on the SR2 providing the value of x1 to the SW. A state writer block (e.g., the SW) may be associated with writing received information to a state of a particular block. For example, the client device may cause the SW to write the value for x1 as a value of "x2," a variable associated with the second state system. Based on the logical operation evaluating to true and the function-call being completed, the client device may cause blocks of the second state system to be executed.

Figure 2:
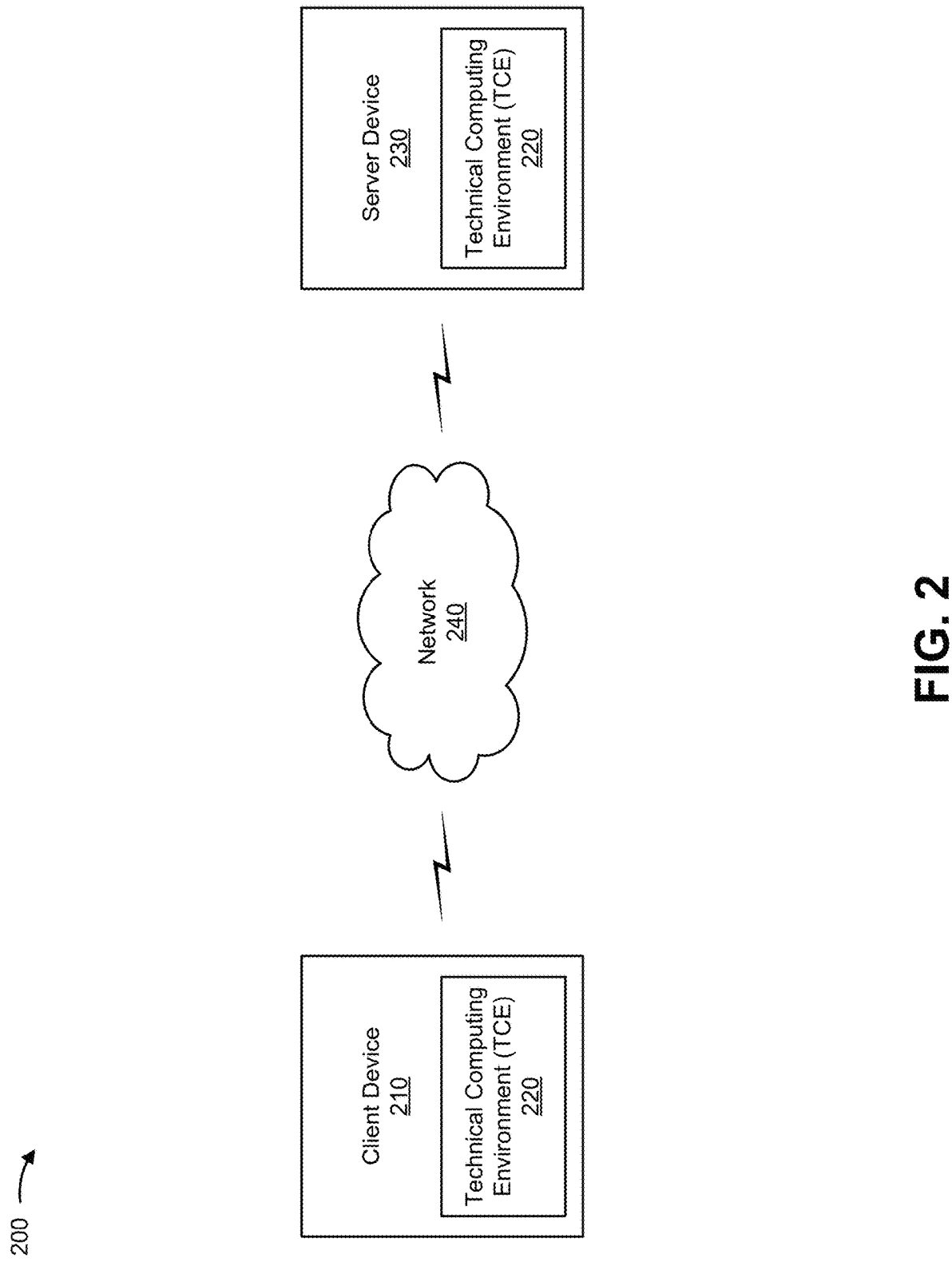
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a client device 210, which may include a technical computing environment (TCE) 220. Furthermore, environment 200 may include a server device 230, which may include TCE 220, and a network 240. Devices of environment 200 may interconnect via wired connections, wireless connections, or a combination of wired and wireless connections.

Client device 210 may include one or more devices capable of receiving, generating, storing, processing, and/or providing information associated with a model (e.g., a model element, a block, an input signal, a portion of program code, or the like). For example, client device 210 may include a computing device, such as a desktop computer, a laptop computer, a tablet computer, a mobile phone (e.g., a smart phone, a radiotelephone, etc.), or a similar device. Client device 210 may establish a state access block (e.g., a block that lacks a temporal operation but may implicitly access a state of a block that includes a temporal operation, such as a state reader block, a state writer block, or the like). In some implementations, client device 210 may provide a graphical user interface (GUI) for viewing and/or interacting with a model and/or one or more features associated therewith. In some implementations, client device 210 may receive information from and/or transmit information to server device 230.

Client device 210 may host TCE 220. TCE 220 may include any hardware-based component or a combination of hardware and software-based components that provides a computing environment that allows tasks to be performed (e.g., by users) related to disciplines, such as, but not limited to, mathematics, science, engineering, medicine, and business. TCE 220 may include a text-based environment (e.g., MATLAB® software by The MathWorks, Inc.; Octave; Python; JavaScript; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dassault Systemes; etc.), a graphically-based environment (e.g., Simulink® software, Stateflow® software, SimEvents® software, Simscape™ software etc., by The MathWorks, Inc.; VisSim by Visual Solutions; LabView® by National Instruments; Agilent VEE by Agilent Technologies; Advanced Design System (ADS) by Agilent Technologies; Agilent Ptolemy by Agilent Technologies; etc.), or another type of environment, such as a hybrid environment that may include, for example, a text-based environment and a graphically-based environment. In some implementations, TCE 220 may include, for example, a user interface and/or enable simulation and execution of hardware and/or software systems.

TCE 220 may be integrated with or operate in conjunction with a modeling environment, which may provide graphical tools for constructing models (e.g., graphical models) of systems and/or processes that include model elements, such as blocks or the like. TCE 220 may include additional tools, such as tools designed to convert a model into an alternate representation, such as an alternate model format, code or a portion of code representing source computer code and/or compiled computer code, a hardware description (e.g., a specification of a digital circuit, a description of a circuit layout, etc.), or the like. TCE 220 may also include tools to convert a model into project files for use in an integrated development environment (IDE) such as Eclipse by Eclipse Foundation, IntelliJ IDEA by JetBrains or Visual Studio by Microsoft. A model (e.g., a graphical model) may include one or more model elements that simulate characteristics of a system and/or a process. Each model element may be associated with a graphical representation thereof that may include a set of objects, such as block diagram blocks, ports, connector lines, or the like.

A model may include a set of model elements (e.g., blocks) that, when executed by client device 210 (e.g., TCE 220), simulate behavior of the system or a subsystem (e.g., a portion of the system), such as a dynamic system, a natural system, a physical system, or the like. The model may include a system or a subsystem (e.g., a system of model elements, a system of blocks, a subsystem of model elements, a subsystem of blocks, etc.). The modeled system or modeled subsystem may be different from the system or subsystem included in the model.

Server device 230 may include one or more devices capable of receiving, generating, storing, processing, and/or providing a model and/or information associated with a model. For example, server device 230 may include a computing device, such as a server, a desktop computer, a laptop computer, a tablet computer, or a similar device. In some implementations, server device 230 may host TCE 220. In some implementations, client device 210 may be used to access one or more TCEs 220 running on one or more server devices 230. For example, multiple server devices 230 may be used to execute program code (e.g., serially or in parallel), and may provide respective results of executing the program code to client device 210. In some implementations, server device 230 may include multiple TCEs 220, such as via a set of virtual machines.

In some implementations, client device 210 and server device 230 may be owned by different entities. For example, an end user may own client device 210, and a third party may own server device 230. In some implementations, server device 230 may include a device operating in a cloud computing environment. In this way, front-end applications (e.g., a user interface) may be separated from back-end applications (e.g., program code execution). Additionally, or alternatively, server device 230 may perform one, more, or all operations described elsewhere herein as being performed by client device 210.

Network 240 may include one or more wired and/or wireless networks. For example, network 240 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

FIG. 3 is a diagram of example components of a device 300. Device 300 may correspond to client device 210 and/or server device 230. In some implementations, client device 210 and/or server device 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a component that permits communication among the components of device 300. Processor 320 may include a processor (e.g., a central processing unit (CPU), a graphics processing unit (GPU), an accelerated processing unit (APU), etc.), a microprocessor, and/or any processing component (e.g., a field-programmable gate array (FPGA), an application-specific integrated circuit (ASIC), etc.) that interprets and/or executes instructions, and/or that is designed to implement one or more computing tasks. In some implementations, processor 320 may include multiple processor cores for parallel computing. Memory 330 may include a random access memory (RAM), a read only memory (ROM), and/or another type of dynamic or static storage device (e.g., a flash memory, a magnetic memory, an optical memory, etc.) that stores information and/or instructions for use by processor 320.

Storage component 340 may store information and/or software related to the operation and use of device 300. For example, storage component 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. In some implementations, storage component 340 may store TCE 220.

Input component 350 may include a component that permits device 300 to receive information, such as via user input (e.g., a touch screen display, a keyboard, a keypad, a mouse, a button, a switch, a microphone, etc.). Additionally, or alternatively, input component 350 may include a sensor for sensing information (e.g., a global positioning system (GPS) component, an accelerometer, a gyroscope, an actuator, etc.). Output component 360 may include a component that provides output information from device 300 (e.g., a display, a speaker, one or more light-emitting diodes (LEDs), etc.).

Communication interface 370 may include a transceiver-like component (e.g., a transceiver, a separate receiver and transmitter, etc.) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIGS. 4A-4G are diagrams of an example implementation 400 of utilizing a state access block in a model of a system.

Figure 4A:
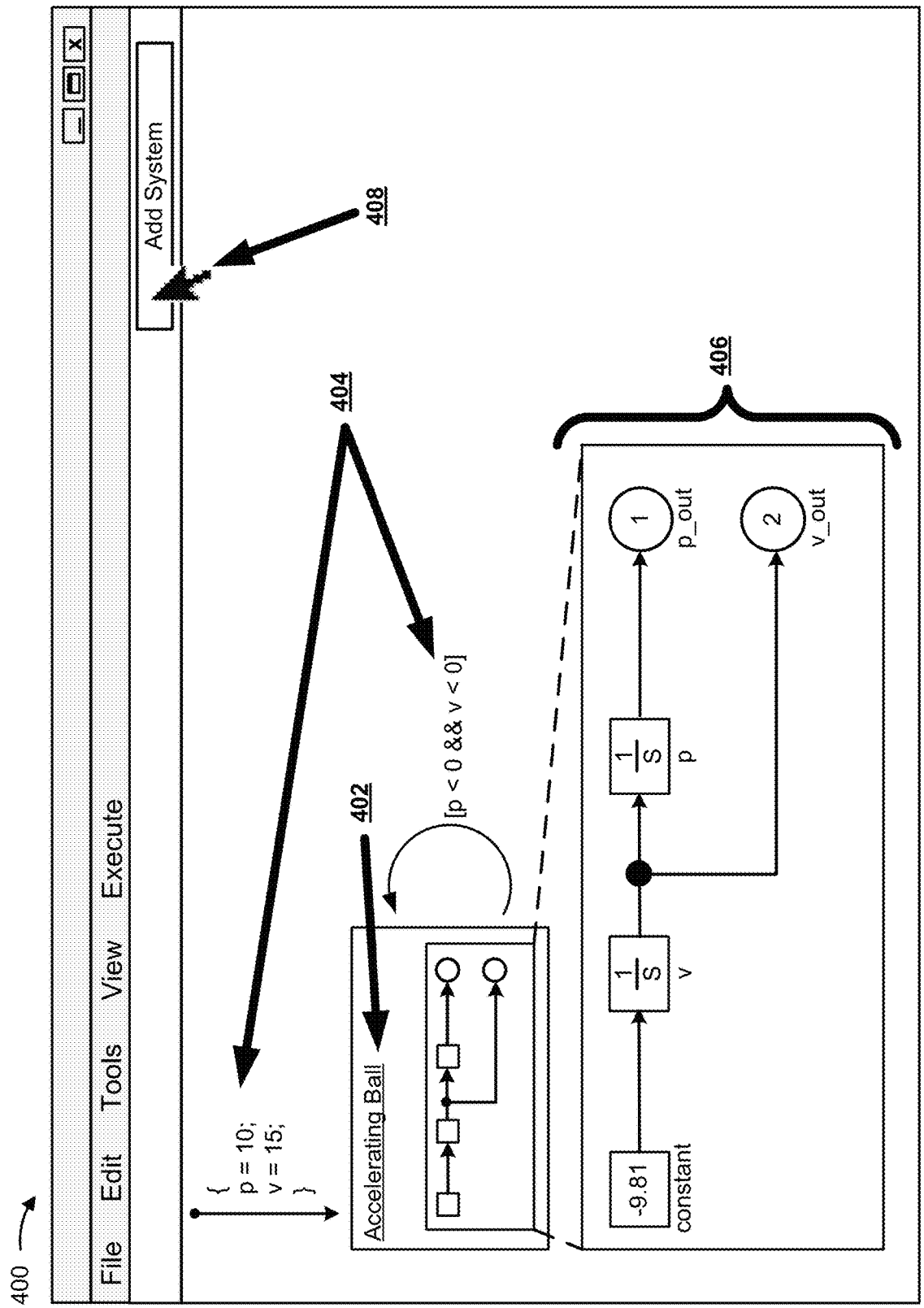
FIGS. 4A-4G are diagrams of an example implementation of utilizing a state access block in a model.

As shown in FIG. 4A, and by reference number 402, client device 210 may provide a first system 402 (e.g., a state diagram, "Accelerating Ball") for display. As shown by reference number 404, first system 402 is associated with a default transition (e.g., a set of values, "p=10" and "v=15" associated with initializing a state for the first system) and a conditional transition (e.g., a transition that is executed when a transition condition, "p<0 && v<0," is satisfied) that is set to perform a self-transition from first system 402 to first system 402.

As further shown in FIG. 4A, and by reference number 406, first system 402 includes a second system 406. Second system 406 includes a set of model elements (e.g., a constant model block, a first integrator block "v," a second integrator block "p," a first output block "p_out," and a second output block "v_out"). Assume that second system 406 is associated with simulating a free-falling object (e.g., a graphical model representing an operation of the first system). Assume that the user desires to add a third system, which executes when the transition condition evaluates to true, to first system 402. As shown by reference number 408, client device 210 is instructed to add the third system to first system 402 shown in FIG. 4A.

Figure 4B:
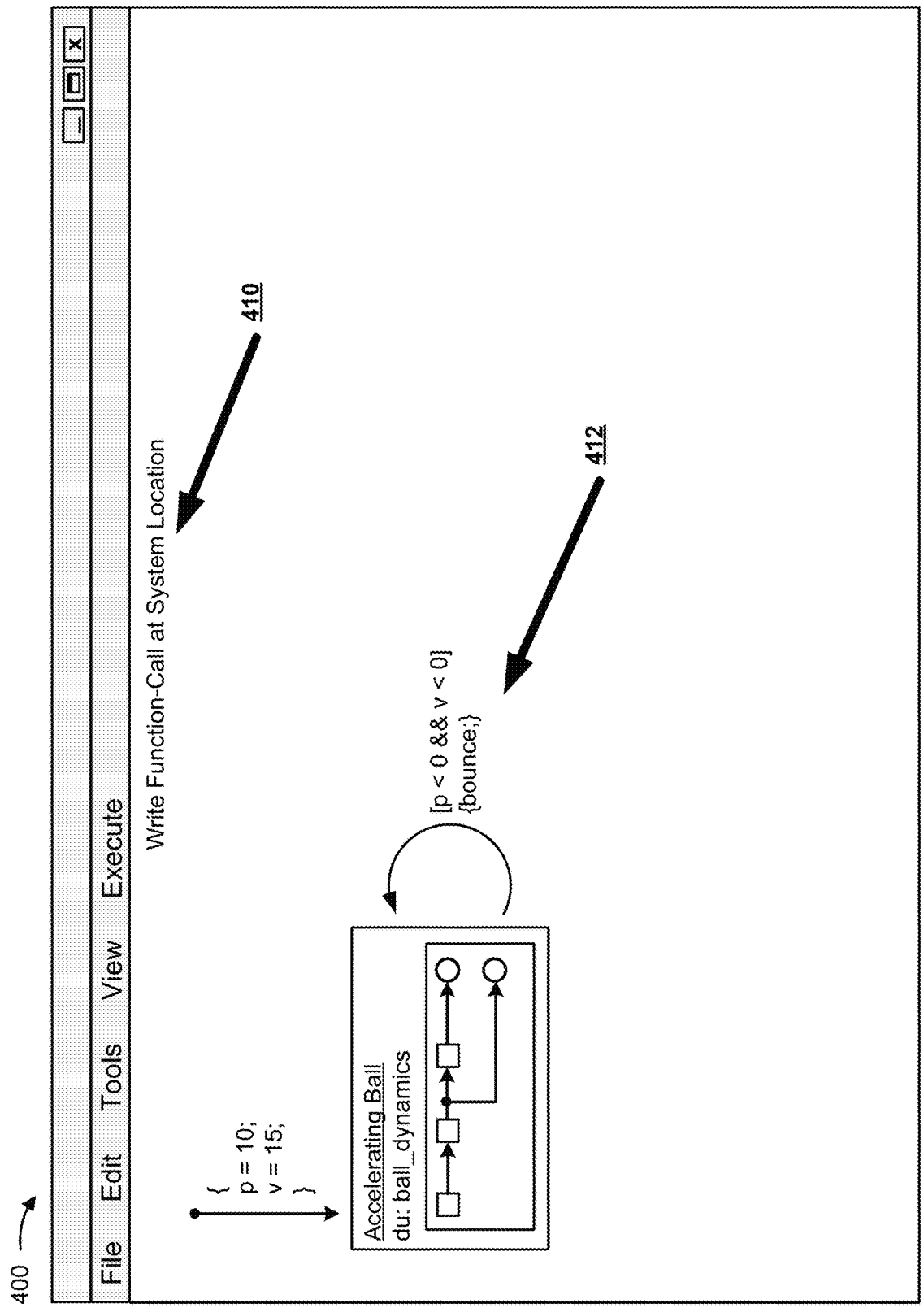

As shown in FIG. 4B, and by reference number 410, client device 210 indicates that a function-call can be written at a particular location for calling third system 410. As shown by reference number 412, information can be received identifying function-call 412. Function-call 412 may include program code that causes third system 410 to be executed. For example, program code "bounce;" is included at the particular location to indicate that third system 410, identified as "bounce," is to be executed when the transition condition is satisfied. In another example, the user may position third system 410 at the particular location without program code associated with performing function-call 412.

Figure 4C:
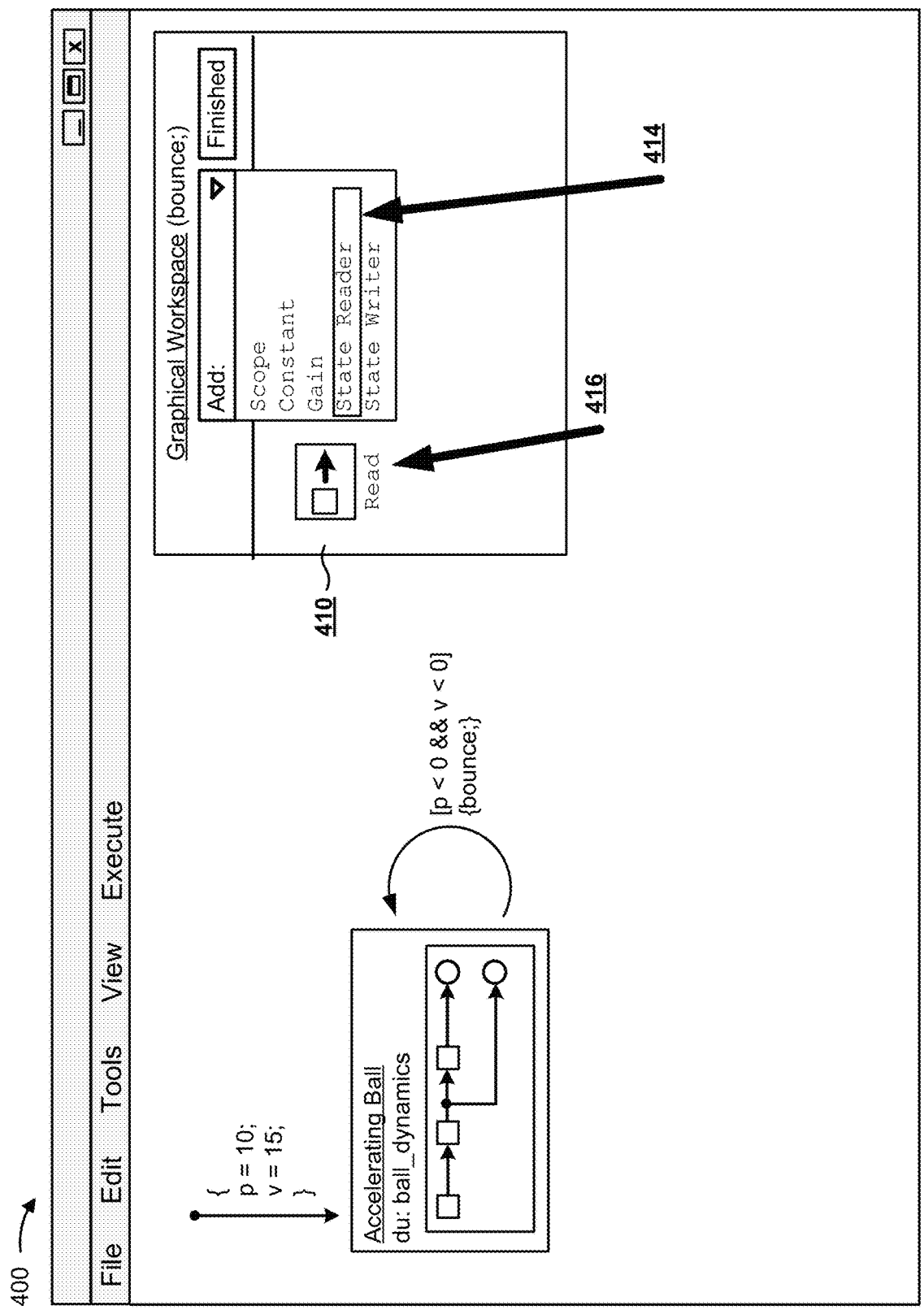

As shown in FIG. 4C, client device 210 provides a graphical workspace for creating third system 410. As shown by reference number 414, a drop-down menu can be utilized to select a state reader block. As shown by reference number 416, client device 210 may position the state reader block (e.g., "Read") in the workspace.

Figure 4D:
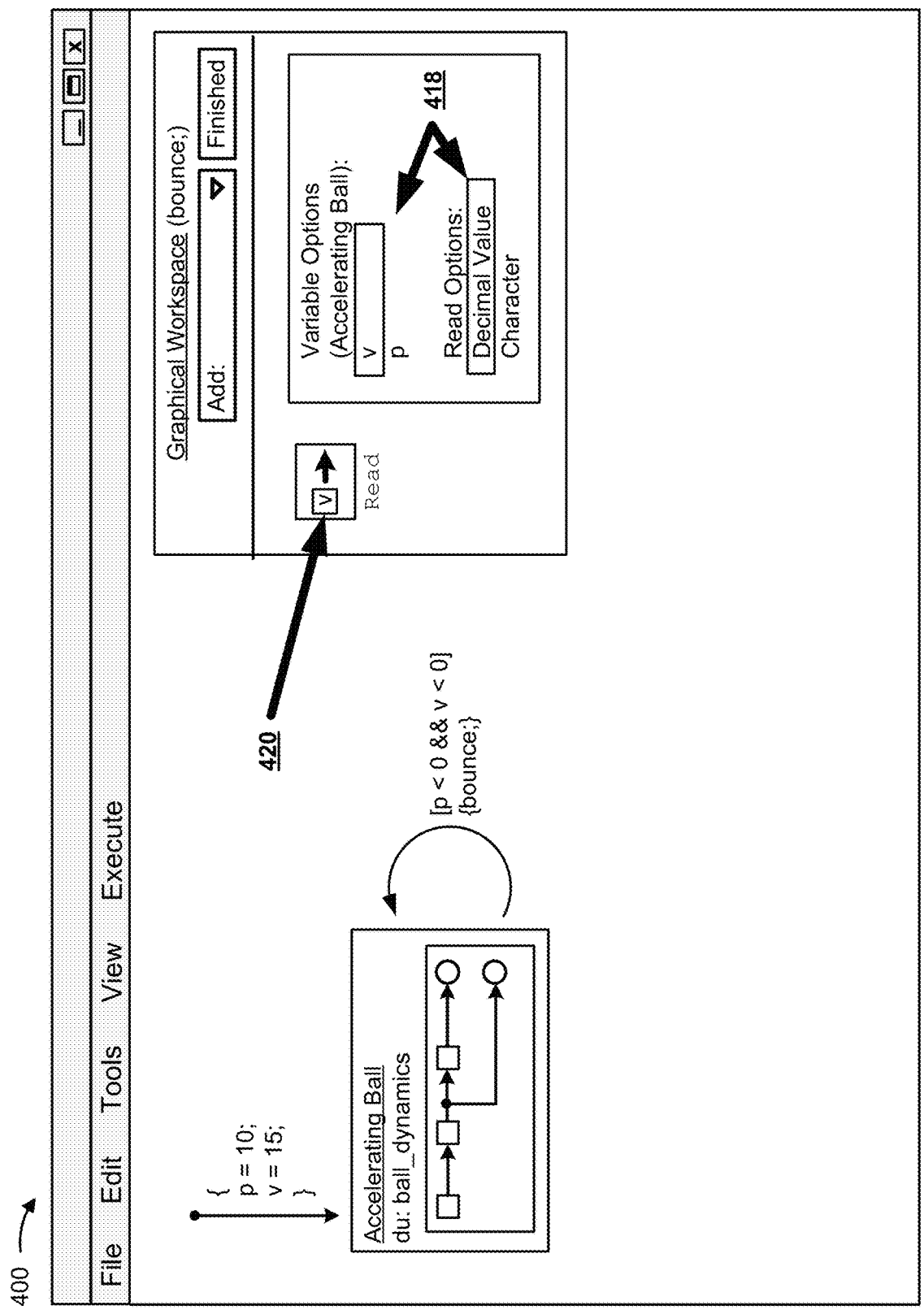

As shown in FIG. 4D, client device 210 can provide a set of parameter options for the state reader block. For example, client device 210 can provide an option for selecting which variable the state reader block is to read (e.g., "v" or "p"). As another example, client device 210 can provide an option for selecting what value the state reader block is to read from the variable (e.g., a decimal value or a character value). As shown by reference number 418, client device 210 indicates that the state reader block is to read a decimal value from variable "v." As shown by reference number 420, client device 210 causes an indication of the variable "v" to be displayed via the state reader block, thereby easing comprehension of how the state reader block is intended to function.

Figure 4E:
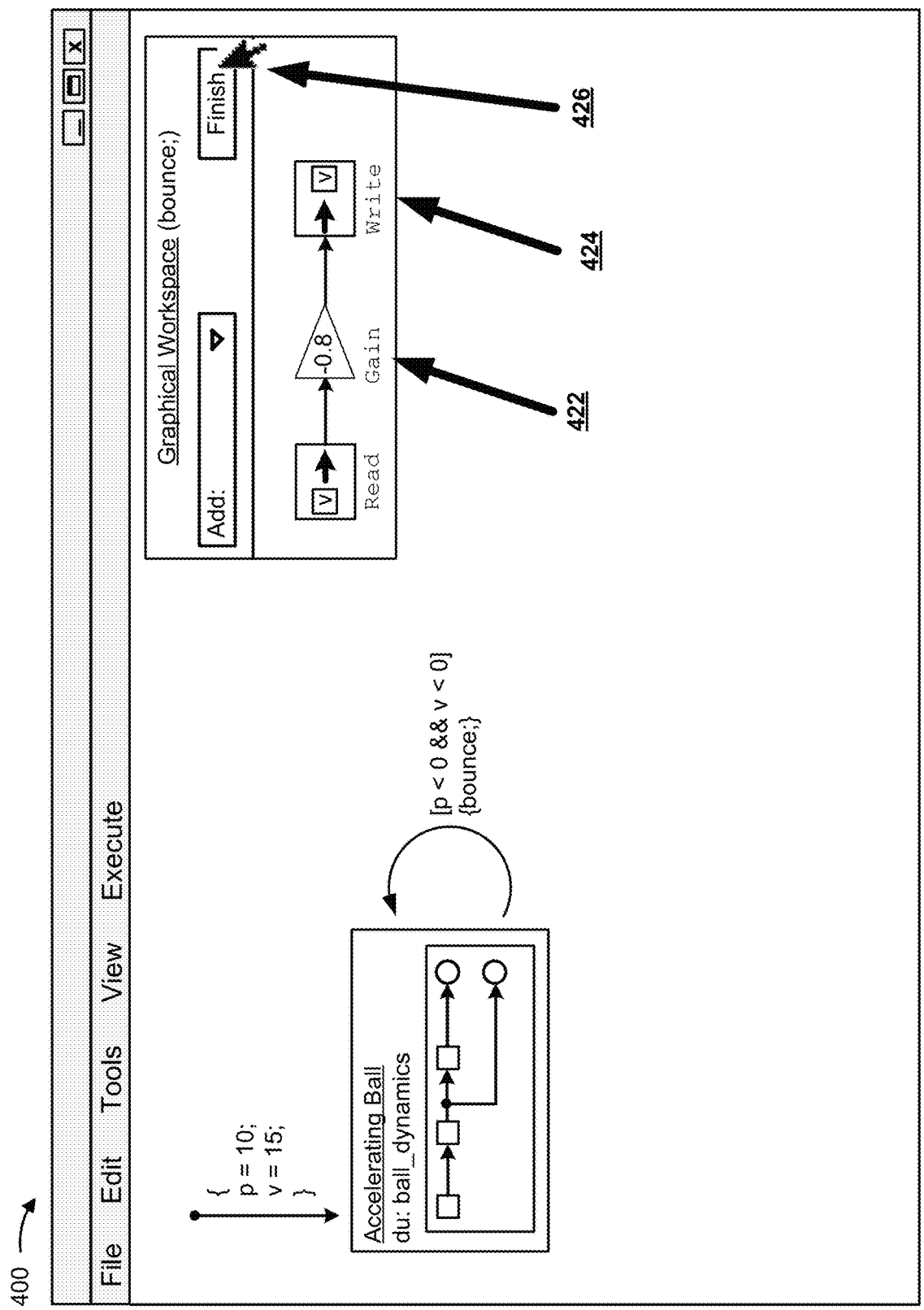

As shown in FIG. 4E, and by reference number 422, the user adds a gain block (e.g., "Gain") that is associated with a particular gain value (e.g., "−0.8"). As shown by reference number 424, the user adds a state writer block (e.g., "Write"). The state writer block is associated with writing received information as a state of variable "v." As shown by reference number 426, client device 210 may finalize the third system. In this way, client device 210 may graphically represent a discrete dynamic system that is associated with simulating a transition for a continuous dynamic system.

Figure 4F:
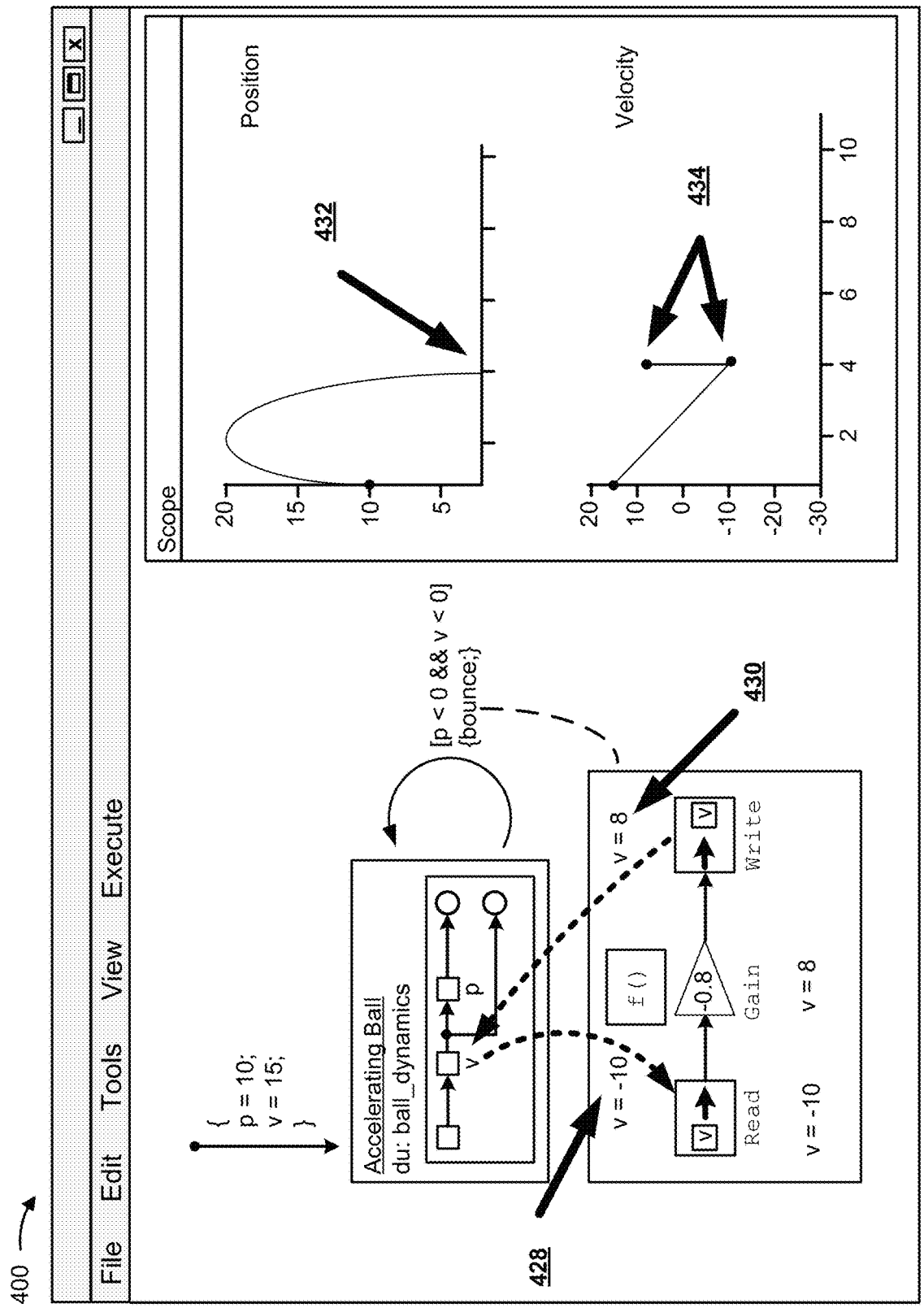

With regard to FIG. 4F, assume that the user causes the first system to be executed to simulate a collision of a bouncing ball. Assume that during a simulation of a collision of the bouncing ball with a surface, indicated by reference number 432, the transition condition (e.g., "[p<0 && v<0]") evaluates to true. Based on the transition condition evaluating to true, client device 210 causes the third system to be executed during the self-transition from the first system to the first system. As shown by reference number 428, client device 210 causes the state reader block to be executed and to read a value of variable "v" (e.g., "−10") into the third system. Assume that the state reader block passes the value "−10" to the gain block and that the gain block executes to transform the value "−10" into another value "8." As shown by reference number 430, client device 210 causes the state writer block to be executed and to write the value "8" as the value of variable "v." As shown by reference number 434, client device 210 causes a graph of variable "v" to indicate a discontinuous change in the value of variable "v" based on the self-transition and the third system being executed. In this way, a set of state access blocks may be utilized to simulate a discontinuous (e.g., discrete) state transition.

Figure 4G:
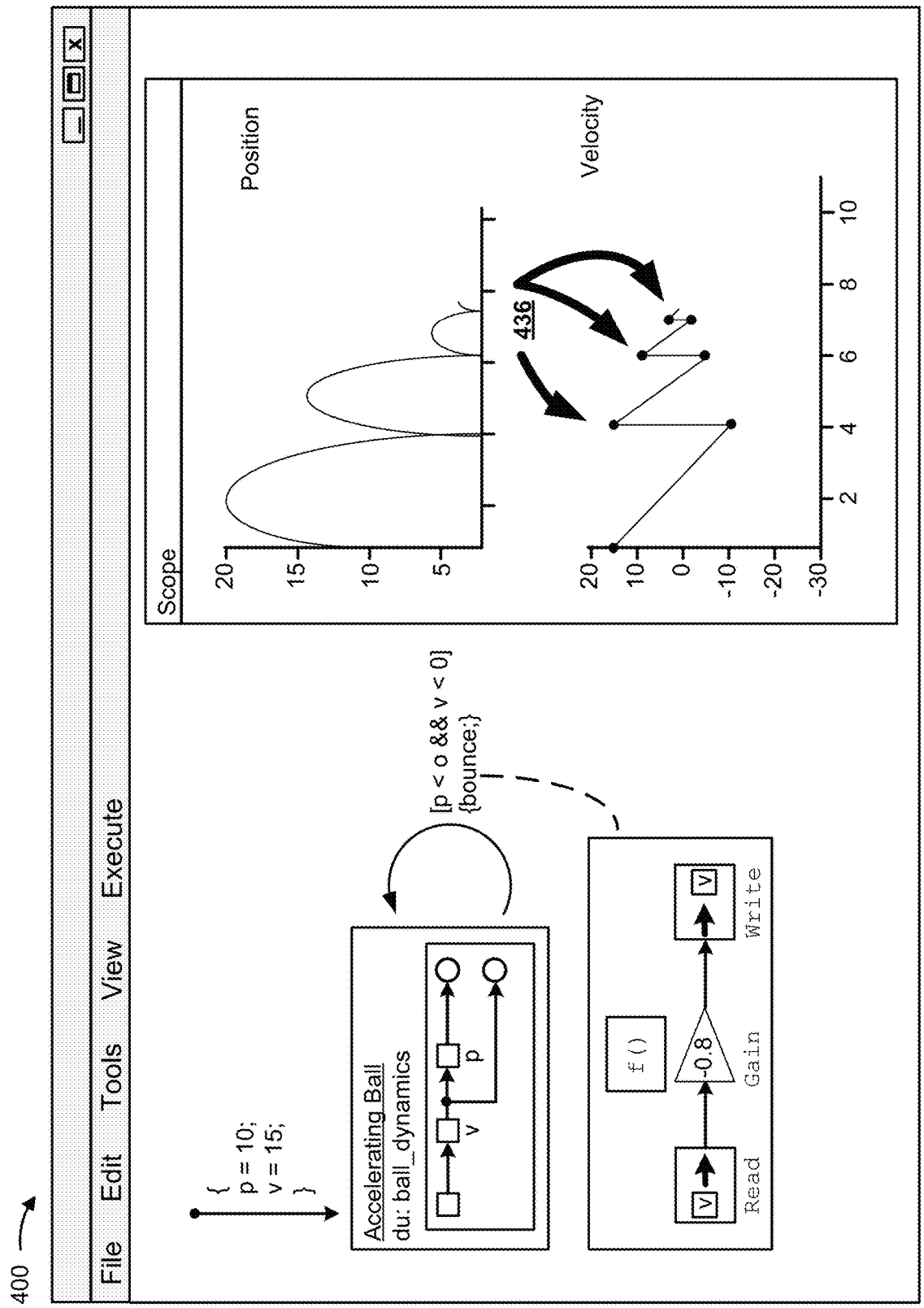

With respect to FIG. 4G, assume that client device 210 has caused first system 402 to undergo additional self-transitions. As shown by reference number 436, client device 210 causes the graph of variable "v" to indicate the additional discontinuous state changes, thereby providing information regarding simulating the bouncing ball.

As indicated above, FIGS. 4A-4G are provided merely as an example. Other examples are possible and may differ from what was described with regard to FIGS. 4A-4G.

Figure 5A:
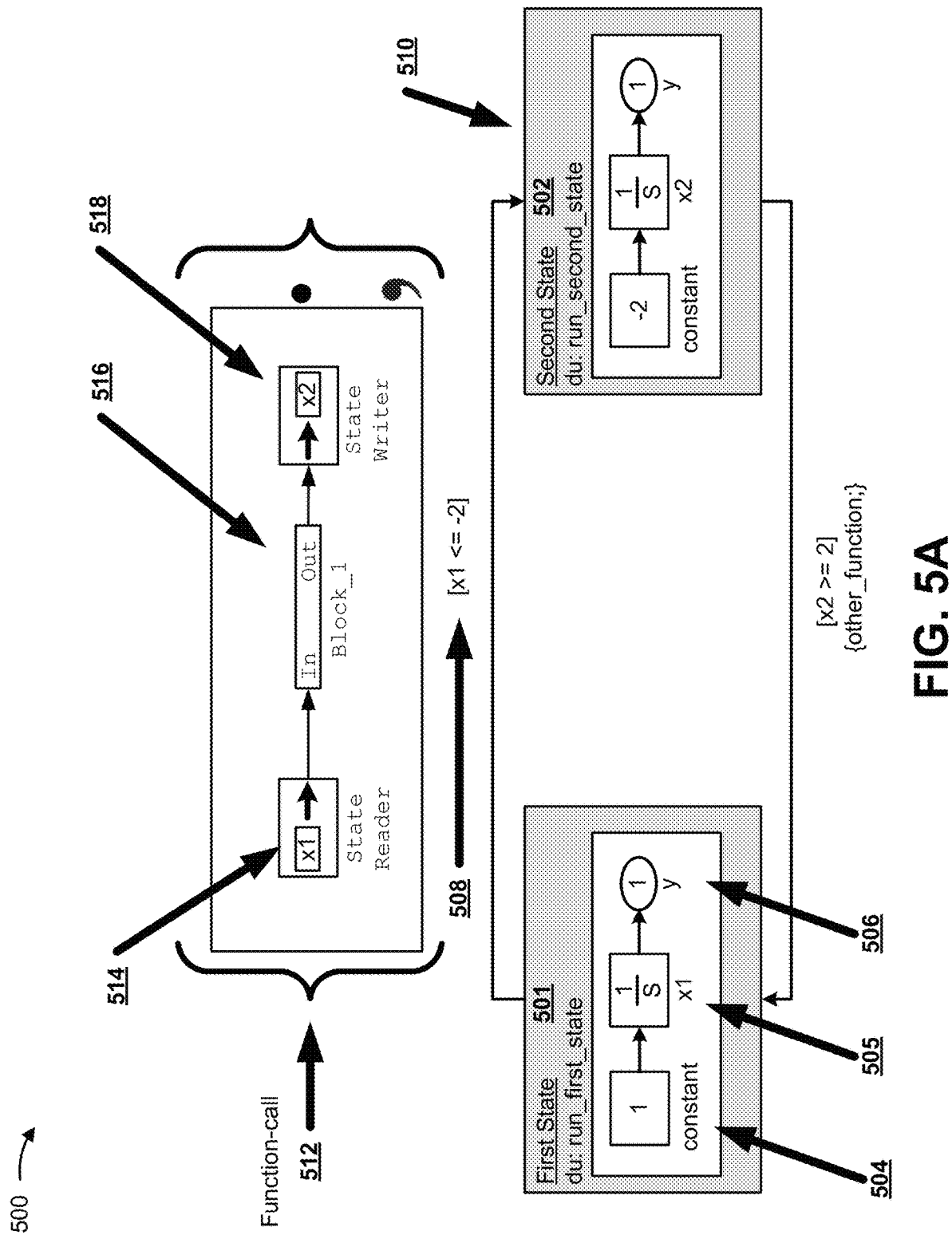
FIGS. 5A-5C are diagrams of an example implementation of utilizing a state access block in a model.
Figure 5B:
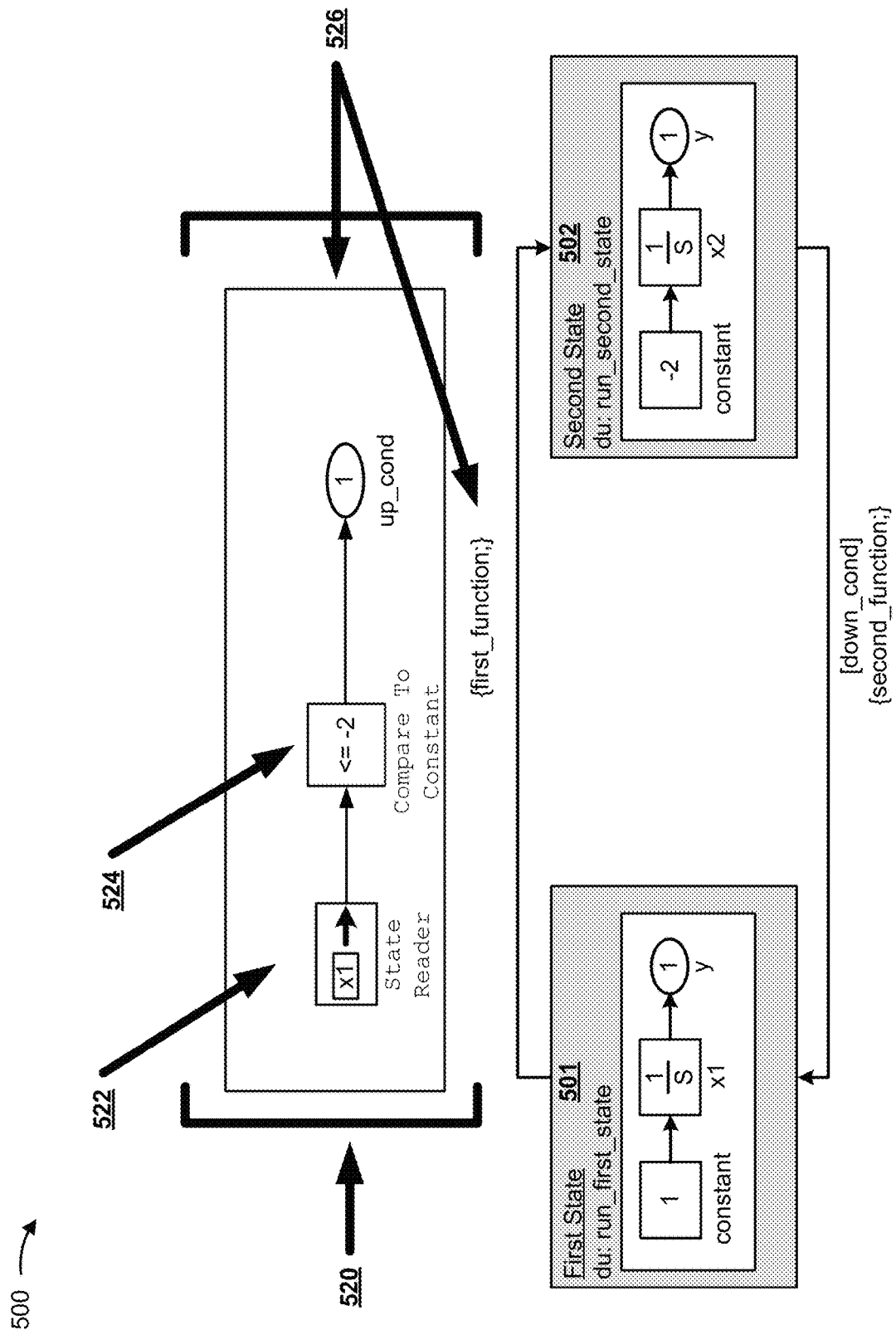
Figure 5C:
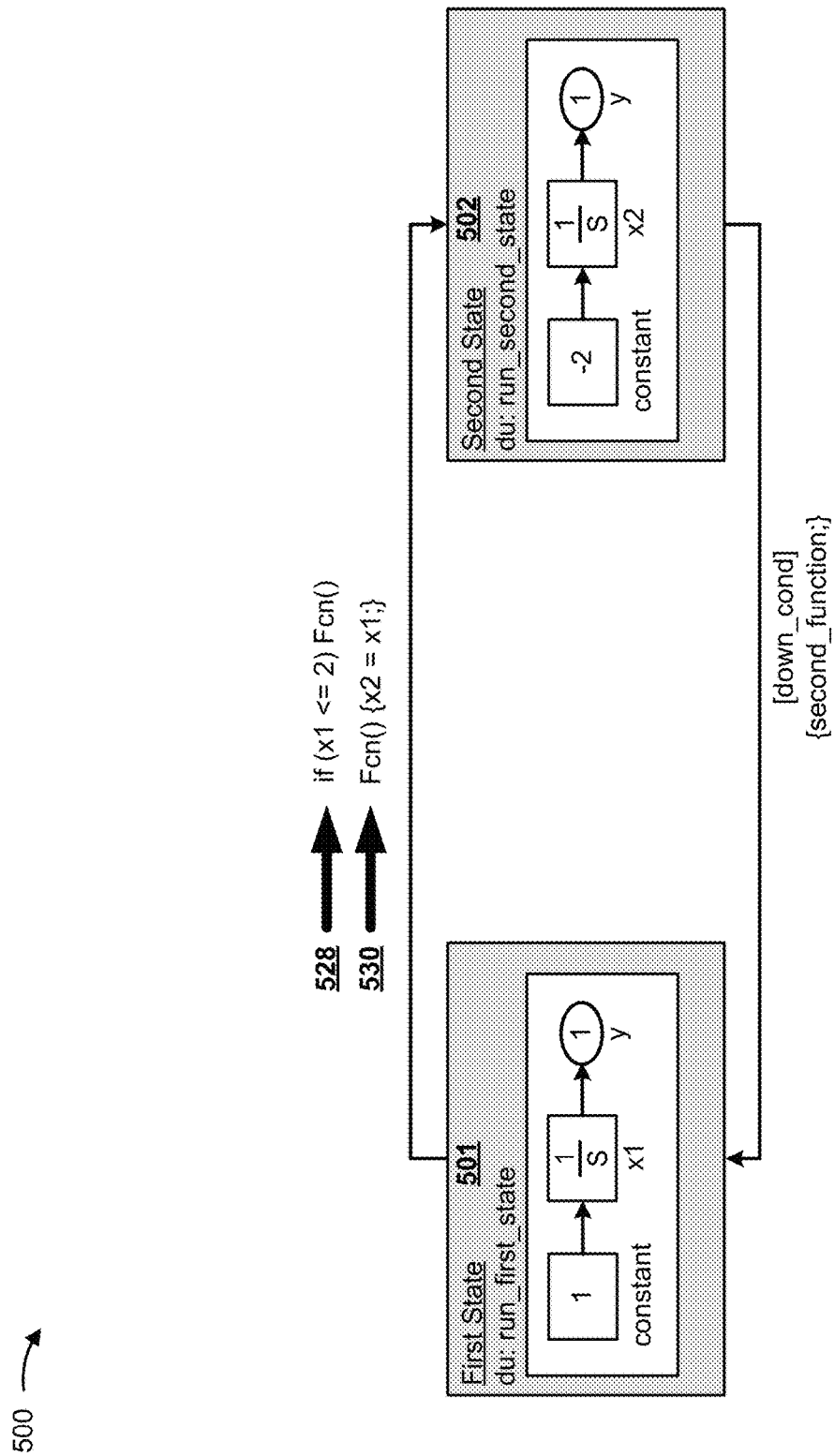

FIGS. 5A-5C are diagrams of an example implementation 500 of utilizing a state access block in a system or a subsystem of a model (e.g., a model that models an external system, such as a natural system, a physical system, or the like). FIGS. 5A-5C show an example of utilizing a state access block in a function-call and/or a transition condition of a set of systems or subsystems of a model to facilitate a transition from a first system associated with a first state to a second system associated with a second state.

As shown in FIG. 5A, the model of the set of systems includes blocks of a first system 501 (e.g., "First State") and blocks of a second system 502 (e.g., "Second State"). First system 501 includes a constant block 504 associated with providing a value to an integrator block 505 that alters the value with respect to a variable, "x1." A block 506 is associated with outputting the altered value. As shown by reference number 508, the model of the set of systems includes a transition condition, "[x1<=−2]," associated with governing when to transition from execution blocks of first system 501 to executing blocks of second system 502. As shown by reference number 510, based on the transition condition being satisfied, client device 210 may cause the transition from executing first system 501 to executing second system 502.

With respect to FIG. 5A, assume that client device 210 determines that the transition condition evaluates to true at a particular time-step of executing blocks of first system 501. The model of the set of systems includes a function-call 512, blocks of which are executed when transitioning from executing the blocks of first system 501 to executing the blocks of second system 502. Function-call 512 is determined to be executed based on, for example, TCE 220, being configured to execute function-call 512 based on the transition condition evaluating to true (e.g., based on a graphical indication, such as a set of braces "{ }" surrounding function-call 512, based on TCE 220 interpreting a position of function-call 512 relative to other portions of the system, or the like as further described herein). Function-call 512 includes a state reader block 514 associated with, when executed, reading information associated with a state (e.g., a value of "x1") associated with first system 501. Function-call 512 includes a block 516 (e.g., "Block_1") which is associated with a connector and which receives the value of "x1" as an input, alters the input, and provides another value as an output to state writer block 518. State writer block 518 is associated with writing the output from block 516 to alter a state (e.g., to alter a value of "x2") associated with second system 502. For example, state writer block 518 receives the altered value of "x1" from function 516 and writes the altered value as a value of "x2." In this way, a state reader block and a state writer block may facilitate and graphically model a state transition for a system, a set of systems, or the like.

Client device 210 may interpret information included in a model of a system to evaluate aspects of the model. For example, client device 210 may determine that brackets IF associated with transition condition 508 indicate that information included therein is to be evaluated as a conditional statement. Additionally, or alternatively, client device 210 may determine that braces "{ }" associated with function-call 512 indicate that information included therein is to be evaluated based on transition condition 508 evaluating to true. Additionally, or alternatively, client device 210 may utilize a different semantic for identifying a type of evaluation, such as a relative position of transition condition 508, function-call 512, etc.; a user indication of an association between transition condition 508, function-call 512, first system 501, and/or second system 502, etc.; or the like.

As shown in FIG. 5B, a similar model that includes a similar set of systems or subsystems is established. Transition condition 520 is associated with graphically representing a transition condition similar to transition condition 508 of FIG. 5A. Transition condition 520 includes state reader block 522 which reads information regarding a state from first system 501 (e.g., a value for a variable, "x1"). The value of variable "x1" is passed to a compare block 524 (e.g., "Compare To Constant") which compares the value of variable "x1" to a constant value, "−2." If the compare block evaluates to true, then a function 526 (e.g., "first_function") associated with transitioning from executing first system 501 to executing the second system 502 is executed. Client device 210 may determine to execute function 526 based on transition condition 520 evaluating to true based on a configuration of client device 210, a user selection, or another semantic.

In this way, a state reader block and a compare block may facilitate and graphically model a transition condition for a system. In some implementations, a condition may be utilized without a function-call, such as by a first block of the transition condition representing a first result for satisfying the condition and a second block of the transition condition representing a second result for failing to satisfy the condition.

As shown in FIG. 5C, a similar model that includes a similar set of systems or subsystems is established. As shown by reference number 528, a textual transition-condition 528 that utilizes a textual state-handoff (i.e., a textual version of a state reader block) is included. For example, the textual identifier "x1" reads information regarding a state of first system 501 (e.g., a value for a variable "x1"). When the condition of textual transition-condition 528 is satisfied, a function, "FcnQ" is executed. As shown by reference number 530, textual function-call 530 is called to cause execution of the function. The textual function-call includes a textual state-handoff (e.g., "x1") that reads a value of a state of first system 501 (e.g., a value of "x1") and another textual state-handoff (e.g., "x2") that writes a state for second system 502 (e.g., writes a value of "x2"). In this way, a state-handoff associated with a state access block may be performed textually. In some implementations, client device 210 may determine that the textual references "x1" and/or "x2" relate, respectively, to graphical representations of "x1" and "x2" based on a semantic interpretation, a user indication, a pre-configuration, or the like.

While FIGS. 5A-5C show an example of a simple hybrid system with two modes of continuous dynamics, implementations described herein may be utilized to model complex dynamics of systems such as automobiles, airplanes, robots, and other machines that may have more than two modes of dynamics. A state access block associated with a transition may be utilized to model a change in operation of such a system, such as modeling a robotic arm altering from lateral movement to vertical movement.

In this way, a state access block may be utilized to model a state transition.

As indicated above, FIGS. 5A-5C are provided merely as an example. Other examples are possible and may differ from what was described with regard to FIGS. 5A-5C.

Figure 6:
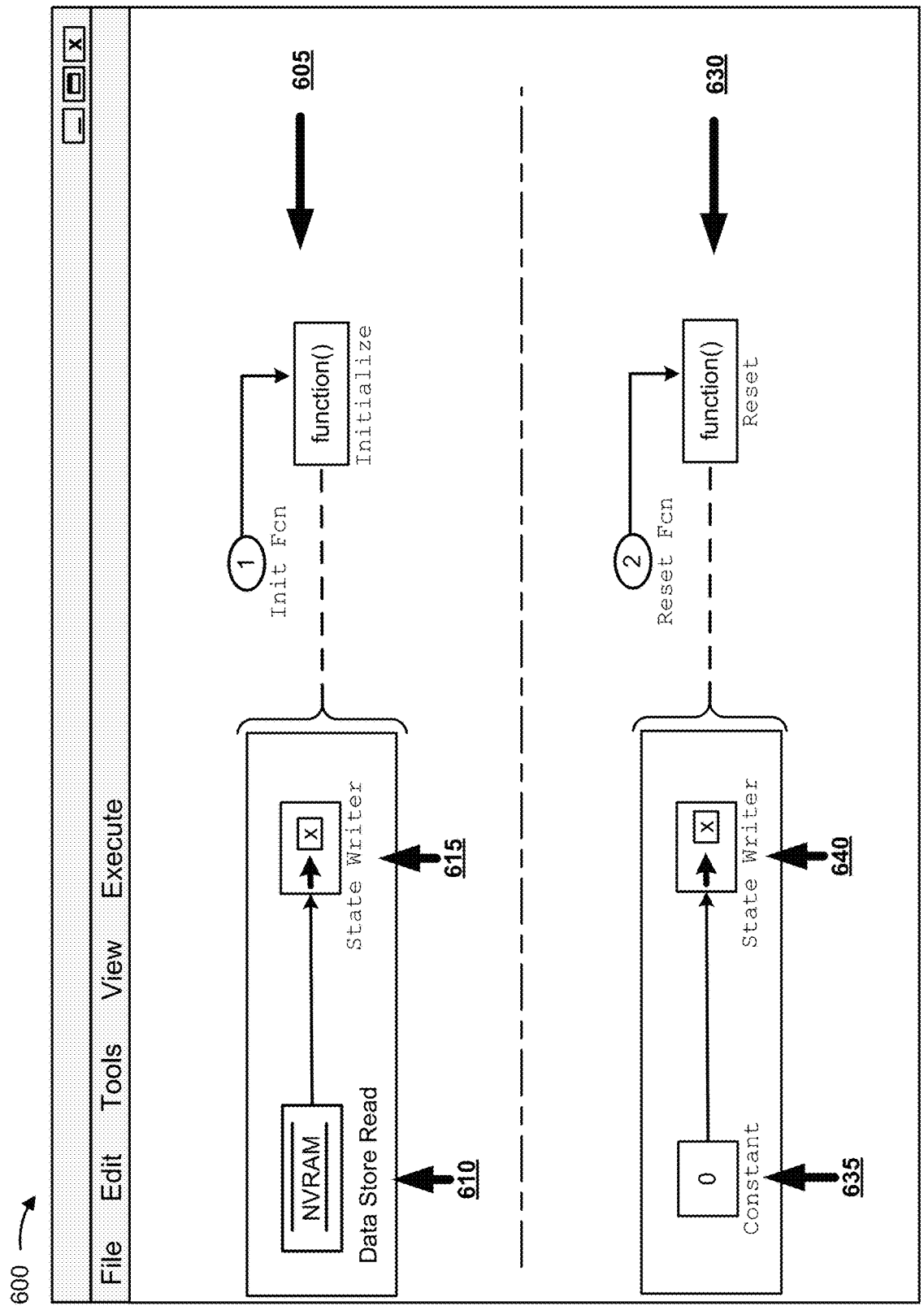
FIG. 6 is a diagram of an example implementation of utilizing a state access block in a model.

FIG. 6 is a diagram of an example implementation 600 of utilizing a state access block in a set of systems of a model (e.g., that models a system, such as a natural system, a physical system, or the like).

As shown in FIG. 6, a first set of blocks 605 may be associated with initializing a system of the model. First set of blocks 605 may include a block associated with reading a value from a non-volatile random-access memory (NVRAM) 610 location. State writer block 615 may receive the value that has been read from NVRAM 610, and may write the value as a state of a particular variable "x," thereby setting an initial state for the system of the model with which first set of blocks 605 is associated. Assume that client device 210 may determine that an initial state is to be set for the system of the model with which first set of blocks 605 is associated based on information, such as semantic information, a user selection, a tag, a graphical indication, or the like. For example, the "Init Fcn" port, shown in FIG. 6, may be associated with a semantic link to the initializing operation. Similarly, the "Reset Fcn" port, shown in FIG. 6, may be associated with a semantic link to a resetting operation.

As further shown by FIG. 6, a second set of blocks 630 may be associated with resetting the system of the model (e.g., with which second set of blocks 630 is associated). Second set of blocks 630 may include a constant block 635 associated with a value, "0." A state writer block 640 may receive the value associated with constant block 635, and may write the value as a state of a particular variable, "x", thereby setting a reset state for the model of the system with which second set of blocks 630 is associated (e.g., the same model of the same system with which first set of blocks 605 is associated).

In this way, a state access block may be utilized to model operations that occur at particular model execution events, such as an initialization event, a termination event, or the like.

As indicated above, FIG. 6 is provided merely as an example. Other examples are possible and may differ from what was described with regard to FIG. 6.

Figure 7:
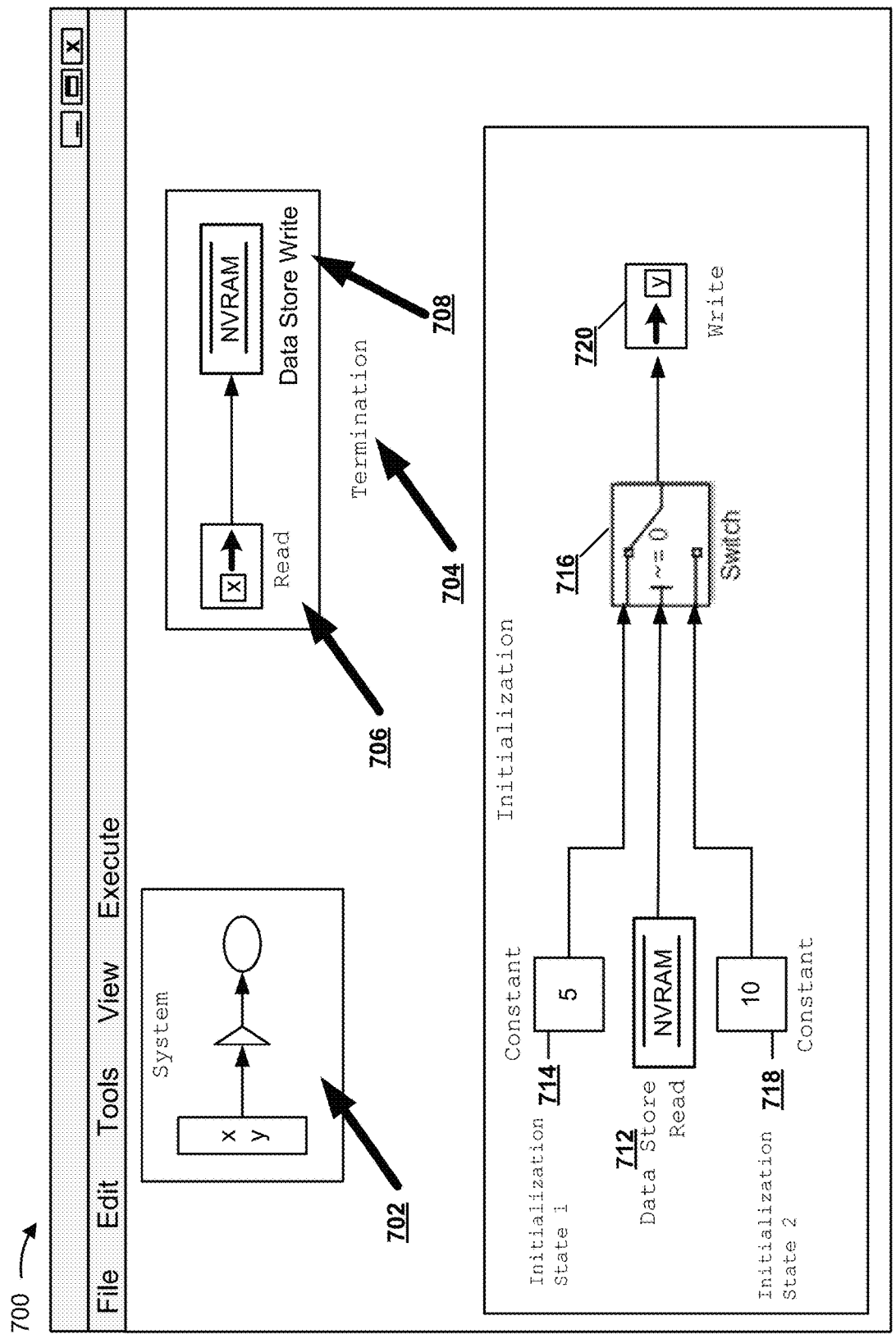
FIG. 7 is a diagram of an example implementation of utilizing a state access block in a model.

FIG. 7 is a diagram of an example implementation 700 of utilizing a state access block in a system of a model (e.g., that models a modeled system).

As shown in FIG. 7, and by reference number 702, a system (e.g., of the model that models a modeled system) may include a set of blocks 702. During simulation of the modeled system by executing the system of the model, execution of the system of the model may terminate and may cause execution of another set of blocks (e.g., another system) associated with termination, as shown by reference number 704. Client device 210 may determine to execute termination 704 based on information associated with blocks 702, such as semantic information, a user selection, or the like. As shown by reference number 706, the set of model elements associated with termination may include a state reader that reads a value of a variable "x." As shown by reference number 708, the state reader block may pass the value of variable "x" to a block (e.g., "Data Store Write") that stores the value via a data structure. In some implementations, client device 210 may execute the state reader block based on all states of the model being executed. For example, a user may provide input indicating that a set of blocks associated with termination be executed when another set of blocks (e.g., set of blocks 702) have each executed.

The system of the model may include a set of different initialization states (e.g., that may correspond to potential initialization states of the modeled system). For example, if the system terminates execution from a first state associated with a first value of "x," a first set of blocks associated with initialization (e.g., blocks 712, 714, 716, and 720) may initialize the system when the system is executed again. Similarly, if the system terminates execution from a second state associated with a second value of "x," a second set of blocks associated with initialization (e.g., blocks 712, 716, 718, and 720) may initialize the system when the system is executed again. Assume that with regard to simulation of the modeled system, execution of the system of the model may commence with an initialization operation that includes execution of one or more blocks associated with initialization. As shown herein, some blocks may be included in the first set of blocks associated with initialization and the second set of blocks associated with initialization. As shown by reference number 712, a value of the variable "x" may be read into the first set of blocks associated with initialization, or, alternatively, the second set of blocks associated with initialization from NVRAM by a data store read block. Assume that the value of "x" indicates that the first initialization state is to be utilized. A constant block 714 value associated with the first initialization state may be passed to a switch block 716. Switch block 716 may also receive a value associated with the second initialization state from constant block 718. Switch block 716 passes the value of constant block 714 to state writer block 720 based on the value of "x" indicating that the first initialization state is to be utilized. State writer block 720 receives the value from constant block 714 and writes the value to a variable, "y," to set the state of "y" to the first initialization state. In this way, multiple initialization states may be facilitated and modeled by a set of state access blocks.

In this way, a system (e.g., the modeled system), such as an electronic control unit (ECU) of an automobile may be modeled by execution of a system of a model. Initialization and termination operations may correspond to a power up and a power down operation of the ECU while a core system may represent a running operation of a control algorithm of the ECU. Utilization of a state access block may facilitate manipulation of states during power up and power down sequences to ensure proper operation of the control algorithm. For example, an odometer reading of the automobile may be written to a persistent memory during a power down and may be read from the persistent memory during a subsequent power up. Although described in terms of an ECU of an automobile, a system such as described with regard to FIG. 7 may also be used in another modeling context, such as in modeling a system of an automobile, an airplane, an industrial control application, or the like.

As indicated above, FIG. 7 is provided merely as an example. Other examples are possible and may differ from what was described with regard to FIG. 7.

Figure 8B:
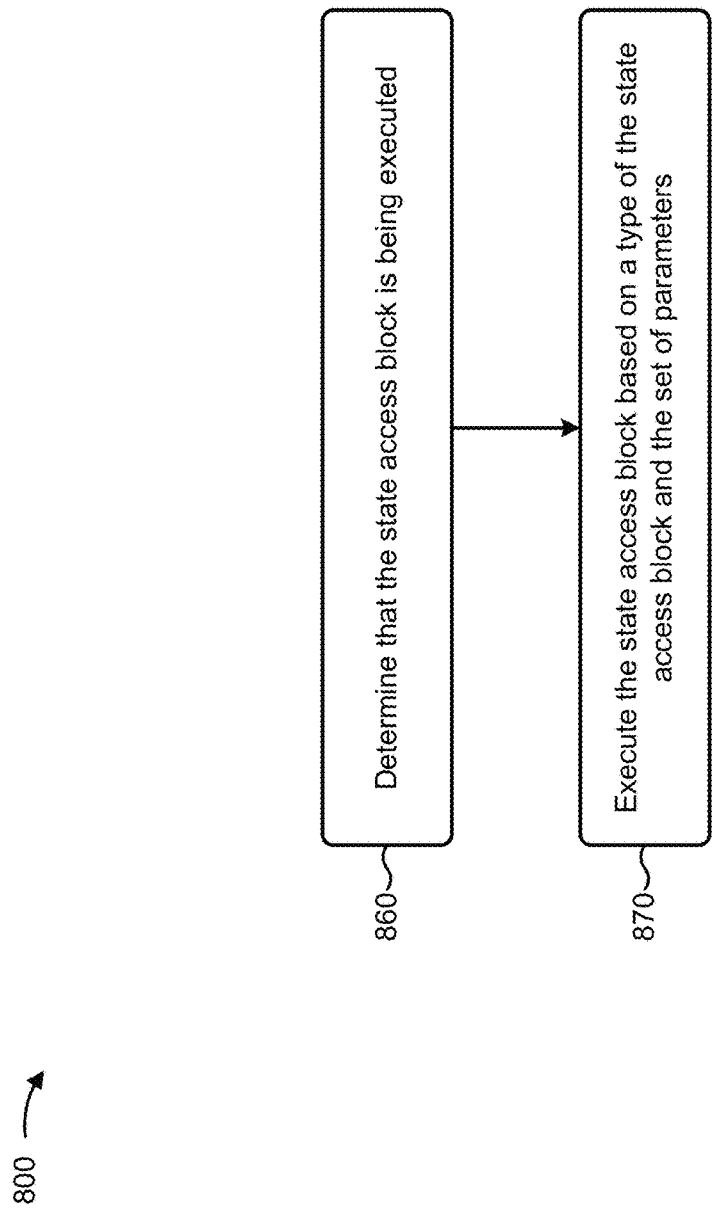

FIGS. 8A and 8B are flow charts of an example process 800 for utilizing a state access block in a model of a system (e.g., a modeled system). In some implementations, one or more process blocks of FIGS. 8A and 8B may be performed by client device 210. In some implementations, one or more process blocks of FIGS. 8A and 8B may be performed by another device or a group of devices separate from or including client device 210, such as TCE 220 and/or server device 230.

As shown in FIG. 8A, process 800 may include receiving a model of a system (block 810). For example, client device 210 may receive the model. In some implementations, client device 210 (e.g., TCE 220) may receive the model. Additionally, or alternatively, client device 210 (e.g., TCE 220) may receive the model based on a user creating the model (e.g., which may include a set of systems or subsystems associated with modeling a set of modeled systems and/or modeled subsystems). For example, a user may cause client device 210 to create or open a user interface. The user may then add one or more model blocks and/or model elements to the user interface to create the model. For example, in some implementations, client device 210 may receive a command, from the user, that indicates that a model block and/or a model element is to be added to the user interface. Client device 210 may receive the command based, for example, on detecting a selection of a particular menu item, entry of a particular textual or audible input from the user, and/or entry of some other predetermined input that indicates a desire to add a model block and/or a model element to the user interface. As another example, client device 210 may receive input (e.g., a drag and drop) that indicates that a model block and/or a model element, included in a block library and/or a model element library associated with TCE 220, is to be added to the user interface. Based on the command, client device 210 may add the model block and/or the model element to the user interface.

In some implementations, client device 210 may receive information identifying the model, such as a name of the model, and information identifying a memory location at which the model is stored. The memory location may be located within client device 210 or external to, and possibly remote from, client device 210. Client device 210 may, based on receiving the request, retrieve the model from the memory location.

In some implementations, client device 210 may receive information identifying a particular type of model, such as a model associated with a hybrid system. A hybrid system may refer to a system that includes both discrete dynamics and continuous dynamics that may be simulated via a discrete dynamic model and a continuous dynamic model, respectively. In this case, client device 210 may utilize a state access block to provide access to information associated with a state of the continuous dynamics by a set of model elements associated with discrete dynamics. In other words, a hybrid system may include continuous time behavior interspersed with discrete changes. Implementations, described herein, may facilitate modeling the discrete changes via the graphical model using state access blocks.

As further shown in FIG. 8A, process 800 may include selecting a state access block for inclusion with the model of the system (block 820). For example, client device 210 (e.g., TCE 220) may select the state access block for inclusion with the model. In some implementations, client device 210 may select the state access block based on a type of the state access block. For example, client device 210 may select a state reader block to read information associated with a state of a system (e.g., another system, another portion of the same system, or the like). Additionally, or alternatively, client device 210 may select a state writer block to write information to a state of a system (e.g., another system, another portion of the same system, or the like).

In some implementations, client device 210 may select a particular state access block associated with accessing information associated with a first system that is a continuous dynamic system and providing the information to a second system that is a discrete dynamic system. In some implementations, the first system and the second system may be different systems modeled by different model elements, the same system modeled by the same model elements, or the like. Additionally, the first system and the second system may be included in a third system. For example, client device 210 may select a particular state access block for inclusion in a first graphical model (e.g., of a continuous dynamic system) that accesses a state associated with a second graphical model (e.g., of a continuous dynamic system), and the first graphical model and the second graphical model may be embedded in a third graphical model (e.g., of a discrete dynamic system).

Additionally, or alternatively, client device 210 may select a particular state access block associated with accessing information associated with a discrete dynamic system and providing the information to a continuous dynamic system. Additionally, or alternatively client device 210 may select a particular state access block associated with accessing information associated with a discrete dynamic system and providing the information to another discrete dynamic system, the same discrete dynamic system, or the like. Additionally, or alternatively client device 210 may select a particular state access block associated with accessing information associated with a continuous dynamic system and providing the information to another continuous dynamic system, the same continuous dynamic system, or the like.

In some implementations, client device 210 may select the state access block based on receiving information identifying a user selection. For example, client device 210 may provide a user interface with which a user may select a state reader block, a state writer block, or the like. Additionally, or alternatively, client device 210 may select the state access block based on information associated with the system, information associated with one or more other model elements, information associated with one or more other state access blocks selected for other systems, or the like. For example, client device 210 may determine that a set of model elements associated with a first system are associated with initializing a state of a second system and may select a state writer block for writing the information to a state of the second system.

Additionally, or alternatively, client device 210 may determine that a set of model elements associated with a first system are associated with resetting a state of a second system and may select a state writer block for writing the state to the second system. Additionally, or alternatively, client device 210 may determine that a set of model elements associated with a first system are associated with terminating execution of a second system and may select a state reader block associated with reading a state from the second system to save the state. Additionally, or alternatively, client device 210 may determine that a set of model elements associated with a first system are associated with evaluating a condition of a second system (e.g., a transition condition of a Stateflow® model) and may select a state reader block to read a state of the second system for a comparison with the condition.

Additionally, or alternatively, client device 210 may determine that a set of model elements associated with a first system is associated with simulating a functionality of a second system and may select a state reader block to read a state of the second system and a state writer block to write another state to the second system after simulating the functionality of the second system. In this case, the state access functionality may extend across the first system and the second system, thereby facilitating a linkage between the first system and the second system.

In some implementations, client device 210 may provide a block library with which the user may select the state access block. For example, client device 210 may provide information identifying a set of state access blocks and may receive a user selection of a particular state access block of the set of state access blocks. Additionally, or alternatively, client device 210 may provide a block library that includes a set of blocks, some of which include functionality associated with state access corresponding to a state access block.

As further shown in FIG. 8A, process 800 may include determining a set of parameters associated with the state access block (block 830). For example, client device 210 (e.g., TCE 220) may determine the set of parameters associated with the state access block. In some implementations, the state access block may be associated with a parameter identifying a state that client device 210 is to access. For example, client device 210 may determine that a state writer block is associated with writing information to a variable (e.g., writing a value to the variable) of a particular system, thereby setting a state for the particular system. Additionally, or alternatively, client device 210 may determine that a state reader block is associated with reading information describing a state (e.g., a value for a variable) of a particular system.

Additionally, or alternatively, client device 210 may determine that a state access block is associated with reading/writing a state from/to a memory cache that may facilitate altering the state according to a particular algorithm between the state being written at, for example, termination and the state being read at, for example, initialization.

In some implementations, client device 210 may determine a parameter associated with an execution order for the state access block. For example, client device 210 may determine that the state access block and/or other model elements are to be executed in a particular pre-specified execution order, that the state access block is to be executed when a set of model elements have finished executing, when all states of a system have been determined, or the like. In some implementations, client device 210 may determine the execution order based on connectivity between model elements including the state access block. For example, client device 210 may determine that the state access block is to be executed after another model element based on a directed connector from the other model element to the state access block.

In some implementations, the state access block may be associated with a parameter identifying a particular variable. For example, when a state of a system (e.g., a state of a filter block having multiple states) is associated with multiple variables having respective values, client device 210 may determine that a state reader block is associated with reading a value for a particular variable of the multiple variables. In this case, client device 210 may include instructions for determining the particular variable, such as by receiving a user indication of the particular variable, identifying the particular variable, or the like. Similarly, client device 210 may determine that a state writer block is associated with writing information to a particular variable of multiple variables. In some implementations, the state access block may be associated with a parameter identifying a particular memory location. For example, the state access block may be associated with reading information regarding a state from a particular memory location, writing information to a particular memory location associated with a particular state, or the like. In some implementations, client device 210 may determine that the state access block is associated with a first semantic that identifies a set of states and a second semantic that identifies a particular state of the set of states. For example, client device 210 may determine that a state reader block is associated with first information identifying a particular set of states (e.g., a name of the set of states) and second information identifying a state of the set of states to read (e.g., a dot notation indicating which state to read or another form of information identifying the state of the set of states).

As further shown in FIG. 8A, process 800 may include including the state access block in the model of the system (block 840). For example, client device 210 (e.g., TCE 220) may include the state access block in the model. In some implementations, client device 210 may determine a position in the model for the state access block. For example, client device 210 may determine one or more related blocks, one or more connectors, or the like, associated with the state access block. In some implementations, client device 210 may determine a set of other model elements (e.g., other blocks and/or connectors associated therewith) associated with the client device at the location. For example, when client device 210 determines that a state reader block is associated with a terminate function of a system, client device 210 may generate a set of connectors and/or a data store write block to include the state reader block in the terminate function of the system. Additionally, or alternatively, when client device 210 determines that a state writer block is associated with an initialize function of a system, client device 210 may generate a set of connectors and/or a data store read block to include the state writer block in the initialize function of the system. Similarly, other functions of a system may include a state access block, such as a setup function, an enable function, a reset function, or the like).

In some implementations, client device 210 may provide, for display, a graphical representation of the state access block in the model when including the state access block in the model. For example, client device 210 may add a graphical representation of the state access block to the model at a particular location of the model (e.g., a location determined based on a user selection, based on processing the model, or the like, thereby providing contextual information regarding associated model blocks, functionality of the system, or the like). In some implementations, client device 210 may include program code associated with the state access block in program code associated with the model. For example, client device 210 may generate program code corresponding to the state access block and may incorporate the generated program code into other program code associated with executing the model of the system. In some implementations, client device 210 may provide, for display, an identifier of information accessed by the state access block. For example, client device 210 may include in the state access block an indicator of a variable being read by a state reader block, a variable being written by a state writer block, or the like.

Figure 9:
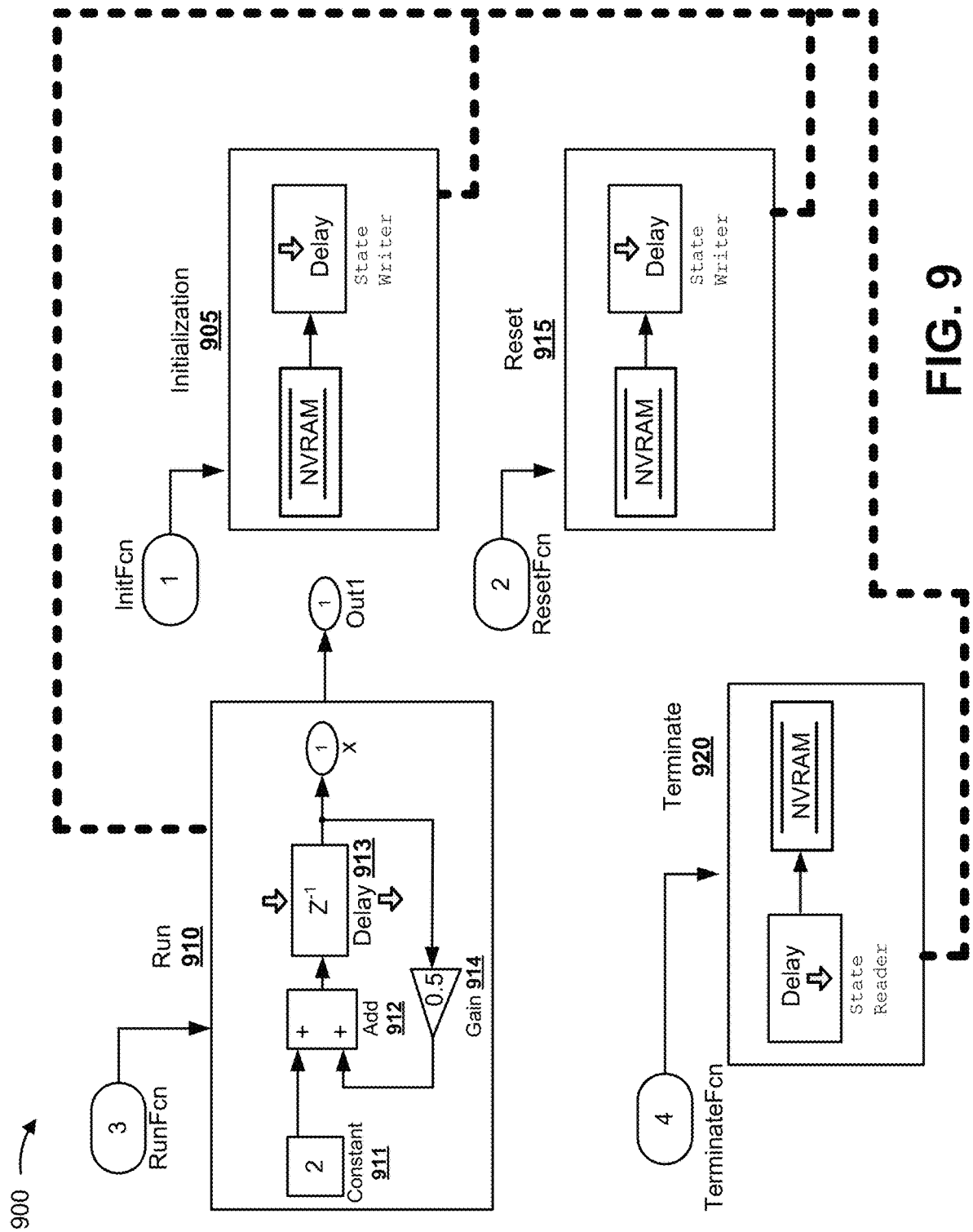
FIG. 9 is a diagram of an example implementation of traceability for state access blocks relating to utilizing a state access block in a model.

In some implementations, client device 210 may provide, for display, a graphical affordance indicating usage of state access blocks as shown in FIG. 9, and as described in more detail with respect to FIG. 9. For example, client device 210 may provide a graphical traceability indication of a model that utilizes state access blocks and a corresponding model associated with the state being accessed by the state access block. In some implementations, client device 210 may provide a textual traceability indication, such as a list of models accessing states of other models, or the like.

As further shown in FIG. 8A, process 800 may include storing information associated with the state access block and the set of parameters (block 850). For example, client device 210 (e.g., TCE 220) may store information associated with the state access block and the set of parameters, such as information identifying the state access block, information identifying a location associated with the state access block, information identifying one or more connectors associated with the state access block, information identifying a memory location to be accessed by the state access block, information identifying a state associated with the state access block (e.g., a state to be read, a state to be written, etc.), or the like.

In some implementations, client device 210 may store program code associated with the state access block and the set of parameters. For example, client device 210 may generate program code associated with a model that includes the state access block and the program code may include particular program code associated with representing accessing a state of another system, performing a state hand-off, or the like. In this case, client device 210 may utilize the program code to execute a model of a system.

As shown in FIG. 8B, process 800 may include determining that the state access block is being executed (block 860). For example, client device 210 may determine that the state access block is being executed. In some implementations, client device 210 may determine that the state access block is being executed based on a simulation step of the model being executed. For example, client device 210 may cause a simulation step associated with the system to be executed and may cause the state access block to be executed during the simulation step. In some implementations, client device 210 may determine that the state access block is being executed based on a user interaction with the model. For example, the user may interact with a user interface and cause the system that is associated with the state access block to be executed, cause the state access block to be executed, or the like. Additionally, or alternatively, client device 210 may determine that the state access block is being executed based on monitoring an execution order, determining that a parameter associated with executing the state access block has been satisfied, or the like. In some implementations, client device 210 may determine a sample time associated with determining to execute the state access block. For example client device 210 may determine the sample time based on a type of operation of which the state access block is accessing a state (e.g., a discrete time operation, a continuous time operation, a finite state machine operation, or the like).

As further shown in FIG. 8B, process 800 may include executing the state access block based on a type of the state access block and the set of parameters (block 870). For example, client device 210 (e.g., TCE 220) may cause the state access block to be executed based on a type of the state access block and the set of parameters. In this case, client device 210 may utilize the state access block to access a state, utilize information associated with a state, or the like.

In some implementations, client device 210 may permit a state access block of a first system to access information associated with a state of a second system when executing the state access block. For example, client device 210 may cause a state writer block, which is not associated with a temporal operation and is associated with a discrete dynamic system, to write information to a memory location associated with another block, which is associated with a temporal operation and is associated with a continuous dynamic system. Additionally, or alternatively, client device 210 may cause a state reader block, which is not associated with a temporal operation (e.g., an integrator, a transfer function, a differential equation, or the like) and is associated with a discrete dynamic system (e.g., a discrete time difference equation, a finite state machine, a discrete event system, or the like), to read information from a memory location associated with another block, which is associated with a temporal operation and is associated with a continuous dynamic system. In this way, client device 210 may facilitate hybrid system modeling.

In some implementations, client device 210 may determine information associated with a state of a system that is to be accessed by the state access block based on the set of parameters. For example, client device 210 may determine, based on a particular parameter associated with the state access block, a memory location associated with a block that the state access block is to access. In this case, client device 210 may cause the state access block to access the memory location, thereby accessing information associated with a state of a system.

Although FIGS. 8A and 8B show example blocks of process 800, in some implementations, process 800 may include additional blocks, fewer blocks, different blocks, or differently arranged blocks than those depicted in FIGS. 8A and 8B. Additionally, or alternatively, two or more of the blocks of process 800 may be performed in parallel.

FIG. 9 is a diagram of an example implementation 900 of traceability for state access blocks.

As shown in FIG. 9, a model of a system (e.g., a natural system, a physical system, etc.) may include a set of models or sub-models (e.g., a set of systems or subsystems included in the model of the modeled system) that include state access blocks and are implicitly linked. A first model, of the set of models, may be implicitly linked to a second model, of the set of models, when a block of the first model access information associated with a block of the second model but the first model and the second model are not wired together (e.g., wired using directed connectors, or the like). FIG. 9 shows an example of providing a traceability graphical affordance in association with a state access block. In this example, the dashed line may represent an implicit linkage between multiple sub-models via state access blocks. For example, when the dashed line connects at the top of a sub-model, the dashed line indicates that the sub-model is associated with a state being read or written by a state access block. In contrast, when the dashed line connects at the bottom of a sub-model, the dashed line indicates that the sub-model includes a state access block reading or writing a state of another sub-model.

With regard to FIG. 9, for example, the model may include initialization 905 that initializes execution of the model of the system, run 910 that includes a set of blocks 911-914 which when executed model the system, a reset 915 that resets the model of the system, and a terminate 920 that terminates execution of the model of the system. Note that, in FIG. 9, the state writer and state reader blocks utilize a notation that provides a graphical indication that the state writer and state reader blocks are associated with delay 913. For example, in FIG. 9, a downward pointing arrow located above the word "delay" in the state writer block may indicate writing a state to delay 913. Similarly, a downward point arrow located below the word "delay" in a state reader block may indicate reading a state from delay 913. Accordingly, the downward pointing arrow above delay 913 and the downward pointing arrow below delay 913 may be a graphical affordance indicating that a state is both written to and read from, respectively, delay 913. In this way, a user may be provided a simplified indication of state access.

In this case, when initialization 905 is executed, information may be read from an NVRAM of initialization 905 to a state writer block of initialization 905 which writes the information as a state of delay block 913 of run 910. Similarly, when reset 915 is executed, information is read from an NVRAM of reset 915 to a state writer block of reset 915, and the state writer block of reset 915 writes the information as a state of delay 913. Similarly, when terminate 920 is executed, a state reader block of terminate 920 reads a state of delay 913 and causes the state to be stored via an NVRAM of terminate 920. Client device 210 may determine when to execute blocks of initialization 905, run 910, reset 915, terminate 920, or the like based on a user indication, a linkage, or another semantic for determining when to execute sub-models of a model.

As indicated above, FIG. 9 is provided merely as an example. Other examples are possible and may differ from what was described with regard to FIG. 9.

In this way, a client device may simplify system complexity when designing a model of a system, thereby reducing processing requirements, memory storage requirements, and modeling errors, and facilitating better integration with existing analysis tools.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

The term program code is to be broadly interpreted to include text-based code that may be automatically executed (e.g., C code, C++ code, Hardware Description Language (HDL) code, very-high-speed integrated circuits (VHSIC) HDL (VHDL) code, Verilog, Java, and/or other types of hardware or software based code that may be compiled and/or synthesized); binary code that may be executed (e.g., executable files that may directly be executed by an operating system, bitstream files that can be used to configure a field programmable gate array (FPGA), Java byte code, object files combined together with linker directives, source code, makefiles, etc.); text files that may be executed in conjunction with other executables. In one example, program code may include different combinations of the above-identified classes (e.g., text-based code, binary code, text files, etc.). Alternatively, or additionally, program code may be of any type, such as function, script, object, etc., and a portion of program code may include one or more characters, lines, etc. of the program code.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A non-transitory computer-readable medium storing instructions, the instructions comprising:
   one or more instructions that, when executed by one or more processors, cause the one or more processors to:
   receive a first model, of a first system, that includes a set of model elements;
      the set of model elements including a state access block,
      the state access block being associated with accessing information regarding a state of a second system represented by a second model, where the second model computes one or more output values based on one or more input values and at least a portion of the state, and
      the state access block implicitly coupling the first model with the second model without needing a graphical connection between the first model and the second model;
   provide, for display and via a user interface, a first graphical representation of the first model and a second graphical representation of the second model without providing, for display, the graphical connection between the first model and the second model, the first graphical representation of the first model including a graphical representation of the state access block; and
   execute the first model comprising executing the state access block, to access the information regarding the state of the second system represented by the second model, based on the implicit coupling between the first model and the second model.

2. The non-transitory computer-readable medium of claim 1, where the first model is associated with a discrete dynamic system and the second model is associated with a continuous dynamic system.

3. The non-transitory computer-readable medium of claim 1,
   where the one or more instructions, when executed by the one or more processors, further cause the one or more processors to:
      determine, based on a set of parameters associated with the state access block, that the state access block is associated with reading the state from the second model of the second system; and
   where the one or more instructions, that cause the one or more processors to execute the first model, cause the one or more processors to:
      read, into the first model, the information regarding the state of the second system based on determining that the state access block is associated with reading the state from the second model of the second system.

4. The non-transitory computer-readable medium of claim 1,
   where the one or more instructions, when executed by the one or more processors, further cause the one or more processors to:
      determine, based on a set of parameters associated with the state access block, that the state access block is associated with writing information from the first model to alter the state of the second system; and
   where the one or more instructions, that cause the one or more processors to execute the first model, cause the one or more processors to:
      write the information from the first model to a memory location associated with the second model to alter the state of the second system based on determining that the state access block is associated with writing the information from the first model.

5. The non-transitory computer-readable medium of claim 1,
   where the one or more instructions, when executed by the one or more processors, further cause the one or more processors to:
      determine that the state access block is associated with initializing the second system; and
      receive an indication that the second model is to be executed; and
   where the one or more instructions, that cause the one or more processors to execute the first model, cause the one or more processors to:

execute the first model based on receiving the indication that the second model is to be executed and based on determining that the state access block is associated with initializing the second system.

6. The non-transitory computer-readable medium of claim 1, where the one or more instructions, when executed by the one or more processors, further cause the one or more processors to:
provide, via the user interface, an indication of the implicit coupling between the first model that includes the state access block and the second model that includes the state for which the information is being accessed using the state access block.

7. A method, comprising:
receiving a first model of a first system,
the receiving the first model being performed by a device,
the first model including a state access block,
the state access block being associated with accessing information regarding a state of a second system represented by a second model, where the second model computes one or more output values based on one or more input values and at least a portion of the state, and
the state access block implicitly coupling the first model with the second model without needing a graphical connection between the first model and the second model;
providing, for display and via a user interface, a first graphical representation of the first model and a second graphical representation of the second model without providing, for display, the graphical connection between the first model and the second model,
the first graphical representation of the first model including a graphical representation of the state access block, and
the providing, for display, the first graphical representation of the first model and the second graphical representation of the second model being performed by the device; and
executing the first model comprising executing the state access block, to access the information regarding the state of the second system represented by the second model, based on the implicit coupling between the first model and the second model,
the executing the first model being performed by the device.

8. The method of claim 7,
where the first model is a discrete dynamic model,
where the second model is a continuous dynamic model, and
where the method further comprises:
providing, for display, an indication of the continuous dynamic model embedded in the discrete dynamic model.

9. The method of claim 7,
where a model element, of the second model, is not associated with a temporal operation, and
where the method further comprises:
causing the model element to access information associated with another model element,
the other model element being associated with the temporal operation, and
the other model element being included in the first model.

10. The method of claim 7, further comprising:
causing a model element, of the second model, to read information associated with a state of the first model into the second model; and
providing the information associated with the state of the first model to a particular model element associated with the second model as an input for execution.

11. The method of claim 7, further comprising:
causing a model element, of the second model, to write particular information associated with the second model to a memory location associated with information associated with a state of the first model.

12. The method of claim 7, further comprising:
causing first information corresponding to information associated with a state of the first model to be read into the second model;
performing a comparison between the first information and second information associated with the second model; and
evaluating a conditional statement for the first model based on performing the comparison.

13. The method of claim 7, further comprising:
reading information associated with a state of the first model into the second model;
causing one or more model elements associated with the second model to be executed to generate modified information based on the information associated with the state of the first model; and
writing the modified information to a memory location associated with the state of the first model,
the modified information being associated with modifying the state of the first model.

14. The method of claim 7, further comprising:
determining a memory location associated with storing information regarding a state for the first model;
receiving the information regarding the state for the first model from the memory location; and
writing the information regarding the state for the first model to another memory location associated with a model element of the first model to set the state of the first model.

15. The method of claim 7,
where a model element, of the second model, is a textual model element; and
where the method further comprises:
performing a state-handoff of information associated with a state of the first model.

16. A device, comprising:
one or more processors to:
receive a first model of a first system
the first model including a state access block,
the state access block being associated with accessing information regarding a state of a second system represented by a second model, where the second model computes one or more output values based on one or more input values and at least a portion of the state, and
the state access block implicitly coupling the first model with the second model without needing a graphical connection between the first model and the second model;
provide, for display and via a user interface, a first graphical representation of the first model and a second graphical representation of the second model without providing, for display, the graphical connection between the first model and the second model, the first graphical representation of the first model including a graphical representation of the state access block; and execute the first model comprising executing the state access block, to access the information regarding the state of the second system represented by the second model, based on the implicit coupling between the first model and the second model.

17. The device of claim 16, where the one or more processors, when executing the first model, are to:
receive the information regarding the state of the second system represented by the second model; and
provide the information regarding the state of the second system represented by the second model to a model element associated with the first model.

18. The device of claim 16, where the one or more processors, are further to:
generate program code associated with the first model,
the program code including particular program code associated with accessing the information regarding the state of the second system represented by the second model; and
causing the program code to be executed to simulate a system,
the system being modeled by the first model.

19. The device of claim 16,
where the first model is a block diagram and the second model is a state diagram; and
where, when executing the first model, the one or more processors are to:
determine that a condition associated with transitioning from a first state of the state diagram to a second state of the state diagram is satisfied; and
execute the first model based on determining that the condition is satisfied.

20. The device of claim 19, where the one or more processors are further to:
read a value associated with the first state of the state diagram;
alter the value to generate a modified value based on executing one or more model elements associated with the block diagram;
provide the modified value to a memory location associated with the state diagram to set the second state; and
transition from the first state to the second state based on setting the second state.

\* \* \* \* \*

UNITED STATES PATENT AND TRADEMARK OFFICE
CERTIFICATE OF CORRECTION

PATENT NO. : 10,853,532 B2
APPLICATION NO. : 14/722487
DATED : December 1, 2020
INVENTOR(S) : Alongkrit Chutinan et al.

Page 1 of 1

It is certified that error appears in the above-identified patent and that said Letters Patent is hereby corrected as shown below:

In the Specification

Column 9, Line 17 reads:
"example, client device 210 may determine that brackets IF"
Should read:
--example, client device 210 may determine that brackets "[]"--

Column 9, Line 63 reads:
"function, "FcnQ" is executed. As shown by reference num-"
Should read:
--function, "Fcn()" is executed. As shown by reference num- --

Signed and Sealed this
Twenty-seventh Day of February, 2024

Katherine Kelly Vidal
*Director of the United States Patent and Trademark Office*